(12) United States Patent  
Kodama

(10) Patent No.: US 10,553,436 B2
(45) Date of Patent: Feb. 4, 2020

(54) METHOD OF MANUFACTURING SEMICONDUCTOR DEVICE USING PHOTORESIST AS ION IMPLANTATION MASK

(71) Applicant: FUJI ELECTRIC CO., LTD., Kawasaki-shi, Kanagawa (JP)

(72) Inventor: Naoko Kodama, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 131 days.

(21) Appl. No.: 15/883,393

(22) Filed: Jan. 30, 2018

(65) Prior Publication Data

US 2018/0269063 A1 Sep. 20, 2018

(30) Foreign Application Priority Data

Mar. 16, 2017 (JP) ................. 2017-051240

(51) Int. Cl.
*H01L 21/266* (2006.01)
*H01L 29/66* (2006.01)
*H01L 21/027* (2006.01)
*H01L 21/04* (2006.01)
*H01L 29/08* (2006.01)
(Continued)

(52) U.S. Cl.
CPC .......... *H01L 21/266* (2013.01); *H01L 21/027* (2013.01); *H01L 21/0273* (2013.01); *H01L 21/0274* (2013.01); *H01L 21/0275* (2013.01); *H01L 21/046* (2013.01); *H01L 29/0692* (2013.01); *H01L 29/0834* (2013.01); *H01L 29/32* (2013.01); *H01L 29/6609* (2013.01); *H01L 29/66348* (2013.01);
(Continued)

(58) Field of Classification Search
CPC . H01L 21/0273; H01L 21/266; H01L 21/027; H01L 21/0275; H01L 21/0274; H01L 21/046
See application file for complete search history.

(56) References Cited

U.S. PATENT DOCUMENTS 5,328,560 A * 7/1994 Hanawa ................ G03F 7/0045
438/516
5,591,654 A * 1/1997 Kishimura .............. G03F 7/023
257/E21.346

(Continued)

FOREIGN PATENT DOCUMENTS

JP h06-204162 A 7/1994
JP 2008-192737 A 8/2008
(Continued)

*Primary Examiner* — John P. Dulka
(74) *Attorney, Agent, or Firm* — Rabin & Berdo, P.C.

(57) ABSTRACT

A method of manufacturing a semiconductor device, including providing a semiconductor wafer, forming a photoresist film on a main surface of the semiconductor wafer, forming a first mask pattern and a second mask pattern on the photoresist film, selectively removing portions of the photoresist film according to the first and second mask patterns, to respectively form a first opening and a second opening in the photoresist film, a position of the second opening differing from that of the first opening, and performing ion implantation of an impurity into the semiconductor wafer, using the photoresist film having the first and second openings formed therein as a mask.

15 Claims, 27 Drawing Sheets

(51) Int. Cl.
  *H01L 29/739* (2006.01)
  *H01L 29/32* (2006.01)
  *H01L 29/861* (2006.01)
  *H01L 29/06* (2006.01)
  *H01L 29/40* (2006.01)
  *H01L 21/265* (2006.01)

(52) U.S. Cl.
  CPC ...... *H01L 29/7397* (2013.01); *H01L 29/8613* (2013.01); *H01L 21/26506* (2013.01); *H01L 29/407* (2013.01)

(56) References Cited

U.S. PATENT DOCUMENTS

| | | | | |
|---|---|---|---|---|
| 6,376,288 | B1* | 4/2002 | Jen | G02F 1/136227 |
| | | | | 438/158 |
| 7,696,049 | B2* | 4/2010 | Hu | H01L 21/266 |
| | | | | 438/289 |
| 8,513,078 | B2* | 8/2013 | Shieh | H01L 29/7855 |
| | | | | 257/E21.19 |
| 8,652,931 | B1* | 2/2014 | Luo | H01L 21/76229 |
| | | | | 438/421 |
| 8,652,965 | B2* | 2/2014 | Suzuki | H01L 21/0272 |
| | | | | 257/680 |
| 9,324,619 | B2* | 4/2016 | Baek | H01L 29/7851 |
| 9,831,134 | B1* | 11/2017 | Lin | H01L 21/266 |
| 2005/0087696 | A1* | 4/2005 | Choi | H01J 3/18 |
| | | | | 250/396 R |
| 2005/0106837 | A1* | 5/2005 | Nakai | H01L 21/76283 |
| | | | | 438/427 |
| 2007/0054198 | A1* | 3/2007 | Park | G03F 7/70466 |
| | | | | 430/5 |
| 2007/0215986 | A1* | 9/2007 | Manger | H01L 21/0332 |
| | | | | 257/632 |
| 2010/0167464 | A1* | 7/2010 | Yamazaki | H01L 27/1214 |
| | | | | 438/104 |
| 2010/0270585 | A1 | 10/2010 | Rahimo et al. | |
| 2011/0287617 | A1* | 11/2011 | Kodama | H01L 23/544 |
| | | | | 438/527 |
| 2014/0145158 | A1* | 5/2014 | Choi | H01L 27/3246 |
| | | | | 257/40 |
| 2014/0159192 | A1 | 6/2014 | Kakefu | |
| 2016/0056081 | A1* | 2/2016 | Baek | H01L 29/7851 |
| | | | | 438/283 |
| 2016/0291457 | A1* | 10/2016 | Ueberreiter | G03F 7/70 |
| 2016/0329323 | A1 | 11/2016 | Iwasaki et al. | |
| 2017/0168389 | A1* | 6/2017 | Park | G03F 7/0045 |
| 2018/0151414 | A1* | 5/2018 | Wu | H01L 21/76229 |
| 2018/0188590 | A1* | 7/2018 | Gu | G02F 1/133504 |
| 2018/0269063 | A1* | 9/2018 | Kodama | H01L 29/32 |
| 2018/0373081 | A1* | 12/2018 | Xu | H01L 27/124 |
| 2018/0373139 | A1* | 12/2018 | Li | G03F 1/58 |
| 2018/0374919 | A1* | 12/2018 | Tilke | H01L 21/31155 |
| 2019/0164772 | A1* | 5/2019 | Tseng | H01L 21/32 |
| 2019/0172717 | A1* | 6/2019 | Ko | H01L 21/3081 |
| 2019/0198467 | A1* | 6/2019 | Tanaka | H01L 24/02 |
| 2019/0214295 | A1* | 7/2019 | Yoon | H01L 21/76802 |
| 2019/0235669 | A1* | 8/2019 | Hu | G06F 3/047 |
| 2019/0237495 | A1* | 8/2019 | Shoyama | H01L 27/1463 |

FOREIGN PATENT DOCUMENTS

| | | |
|---|---|---|
| JP | 2011-503889 A | 1/2011 |
| JP | 2014-135476 A | 7/2014 |
| JP | 2015-118991 A | 6/2015 |

\* cited by examiner

METHOD OF MANUFACTURING SEMICONDUCTOR DEVICE USING PHOTORESIST AS ION IMPLANTATION MASK

CROSS REFERENCE TO RELATED APPLICATIONS

This application is based upon and claims the benefit of priority of the prior Japanese Patent Application No. 2017-051240, filed on Mar. 16, 2017, the entire contents of which are incorporated herein by reference.

BACKGROUND OF THE INVENTION

1. Field of the Invention

Embodiments of the invention relate to a method of manufacturing a semiconductor device.

2. Description of the Related Art

Conventional power devices for which characteristics are enhanced and improved by introducing impurity defects (which become lifetime killers) by ion implantation using high acceleration energy have been developed. For example, in a reverse-conducting IGBT (RC-IGBT) having a structure in which an insulated gate bipolar transistor (IGBT) and a free wheeling diode (FWD) connected with the IGBT in antiparallel are integrated and built-in on a single semiconductor chip, the formation of defects that become lifetime killers in an $n^-$-type drift region by irradiating helium (He) is commonly known.

FIGS. 11 and 12 are cross-sectional views of a structure of a conventional RC-IGBT. In the conventional RC-IGBT depicted in FIG. 11, defects 113 are formed near an interface of an $n^-$-type drift region 101 and a p-type base region 102 by helium irradiation. The defects 113 are not only formed in a FWD region 112, but also in an IGBT region 111. The IGBT region 111 is a region in which an IGBT is arranged. The FWD region 112 is a region in which a FWD is arranged. Further, as depicted in FIG. 12, a RC-IGBT has been proposed in which defects 114 are formed only in the FWD region 112 to reduce leak current and loss in the IGBT region 111 (for example, refer to Japanese Laid-Open Patent Publication No. 2015-118991, Japanese Laid-Open Patent Publication No. 2008-192737, Japanese Laid-Open Patent Publication No. 2014-135476).

In fabricating (manufacturing) such an RC-IGBT, when a diffusion region such as an $n^+$-type emitter region 103 or a $p^+$-type contact region 104 is selectively formed, an impurity is implanted in a semiconductor wafer 110 by ion implantation 122 using, as a mask (shielding film), a photoresist film 121 in which portions corresponding to the regions are open (FIG. 13). FIG. 13 is a cross-sectional view schematically depicting a state when ion implantation is performed using a photoresist film. The photoresist film 121 is formed to have a thickness t101 that corresponds to the range of the impurity of the ion implantation 122, and typically, phosphorus (P), boron (B), arsenic (As), or the like is implanted by the ion implantation 122. Further, the photoresist film 121 is removed by ashing after the ion implantation 122.

Further, Japanese Laid-Open Patent Publication No. 2008-192737 (paragraphs 0025 to 0027) discloses a mask having openings only at a portion corresponding to the FWD region is used to selectively irradiate helium to a predetermined depth in a semiconductor wafer. Japanese Laid-Open Patent Publication No. 2014-135476 (paragraph 0045) discloses that a photoresist film having a predetermined pattern is used as a shielding film to selectively irradiate helium into a semiconductor wafer. Further, a method of using a hard mask 131 such as a metal mask, a silicon (Si), etc. in a case where a photoresist film for which a depth (range) of implantation (irradiation) 132 of an impurity is deep such as in helium irradiation by high acceleration energy or proton (H+) irradiation does not function as a shielding film is known (FIG. 14). Published Japanese-Translation of PCT Application, Publication No. 2011-503889 (paragraphs 0055, 0058, FIGS. 7, 8) disclose that in a RC-IGBT, a thickness of a first mask 14 is increased by introducing a second mask 15 that is a resist mask and hydrogen or helium ion implantation is performed regionally.

FIGS. 14 and 15 are cross-sectional views during ion implantation using a hard mask as a mask. As depicted in FIG. 14, when the hard mask 131 is used as a shielding film in ion implantation of an impurity, the semiconductor wafer 110 and the hard mask 131 are aligned using, as a reference, a mark for alignment pre-formed on the semiconductor wafer 110 and both are fixed by, for example, a clip or screw (not depicted) so that facing main surfaces are not in contact with each other. With the semiconductor wafer 110 and the hard mask 131 in a fixed state, an implantation 132 of an impurity is performed from the hard mask 131 side using a high acceleration energy, whereby a predetermined ion species impurity and defects are introduced only in a predetermined region.

For example, a state of a RC-IGBT during manufacture when the defects 114 are introduced only in the FWD region 112 by helium irradiation is depicted in FIG. 15. As depicted in FIG. 15, after element structures including the IGBT and the FWD are formed on the semiconductor wafer 110, the hard mask 131 is fixed to the semiconductor wafer 110 by, for example, clips, screws (not depicted), etc., so as to face a rear surface (surface on a $p^+$-type collector region 105 side) of the semiconductor wafer 110. The hard mask 131 is used as a mask to irradiate helium from the rear surface of the semiconductor wafer 110, whereby the defects 114 are introduced into only the FWD region 112 by irradiating helium from an opening 131a of the hard mask 131.

SUMMARY OF THE INVENTION

According to an embodiment of the invention, a method of manufacturing a semiconductor device includes applying photoresist to a first main surface of a semiconductor wafer and forming a photoresist film; transferring to the photoresist film, a first mask pattern forming a first opening; transferring to the photoresist film, a second mask pattern forming a second opening in plural, a position of the second opening differing from a position of the first opening; selectively removing the photoresist film based on the first mask pattern and the second mask pattern and forming a resist mask having the first opening and the second opening of the photoresist film; and performing ion implantation of an impurity into the semiconductor wafer, using the resist mask as a mask.

In the embodiment, the method further includes selectively removing the photoresist film based on the first mask pattern and forming the first opening in the photoresist film after transferring the first mask pattern and before transferring the second mask pattern, where selectively removing the photoresist film includes selectively removing the photoresist film based on the second mask pattern and forming the second opening in plural in the photoresist film.

In the embodiment, the method further includes any one of irradiating ultraviolet rays on the resist mask and heating the resist mask after selectively removing the photoresist film based on the first mask pattern and the second mask pattern and forming the resist mask having the first opening and the second opening of the photoresist film and before performing the ion implantation.

In the embodiment, the first opening and the second opening are formed to be separated from each other.

In the embodiment, a depth of the second opening is shallower than a depth of the first opening.

In the embodiment, a width of the second opening is narrower than a width of the first opening.

In the embodiment, a depth of the second opening is 0.5 μm to 1 μm.

In the embodiment, a width of the second opening is 1 μm to 3 μm.

In the embodiment, an opening width of the second mask pattern is 1 μm to 3 μm.

In the embodiment, the second opening of the second mask pattern is arranged in a row at an interval of 1 μm to 3 μm.

In the embodiment, the photoresist is a chemically amplified photoresist. In the embodiment, the photoresist is a positive photoresist.

In the embodiment, the photoresist is a negative photoresist.

In the embodiment, the method further includes forming a first semiconductor element in a first region of the semiconductor wafer and forming a second semiconductor element in a second region of the semiconductor wafer, before applying the photoresist. The first opening of the photoresist film is at a location corresponding to a formation region of the second region. In the embodiment, the first semiconductor element is an insulated gate bipolar transistor; and the second semiconductor element is a diode. Forming the first semiconductor element and the second semiconductor element includes forming in a surface layer of the first main surface of the semiconductor wafer of a first conductivity type, a semiconductor region of a second conductivity type constituting an anode region of the diode and a base region of the insulated gate bipolar transistor. Performing the ion implantation includes implanting the impurity from the first main surface of the semiconductor wafer, the impurity being implanted near an interface of the semiconductor wafer with the semiconductor region of the second conductivity type.

In the embodiment, the first semiconductor element is an insulated gate bipolar transistor; and the second semiconductor element is a diode. Forming the first semiconductor element and the second semiconductor element includes forming in a surface layer of a second main surface of the semiconductor wafer of a first conductivity type, a semiconductor region of a second conductivity type constituting an anode region of the diode and a base region of the insulated gate bipolar transistor. Performing the ion implantation includes implanting the impurity from the second main surface of the semiconductor wafer, the impurity being implanted near an interface of the semiconductor wafer with the semiconductor region of the second conductivity type.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
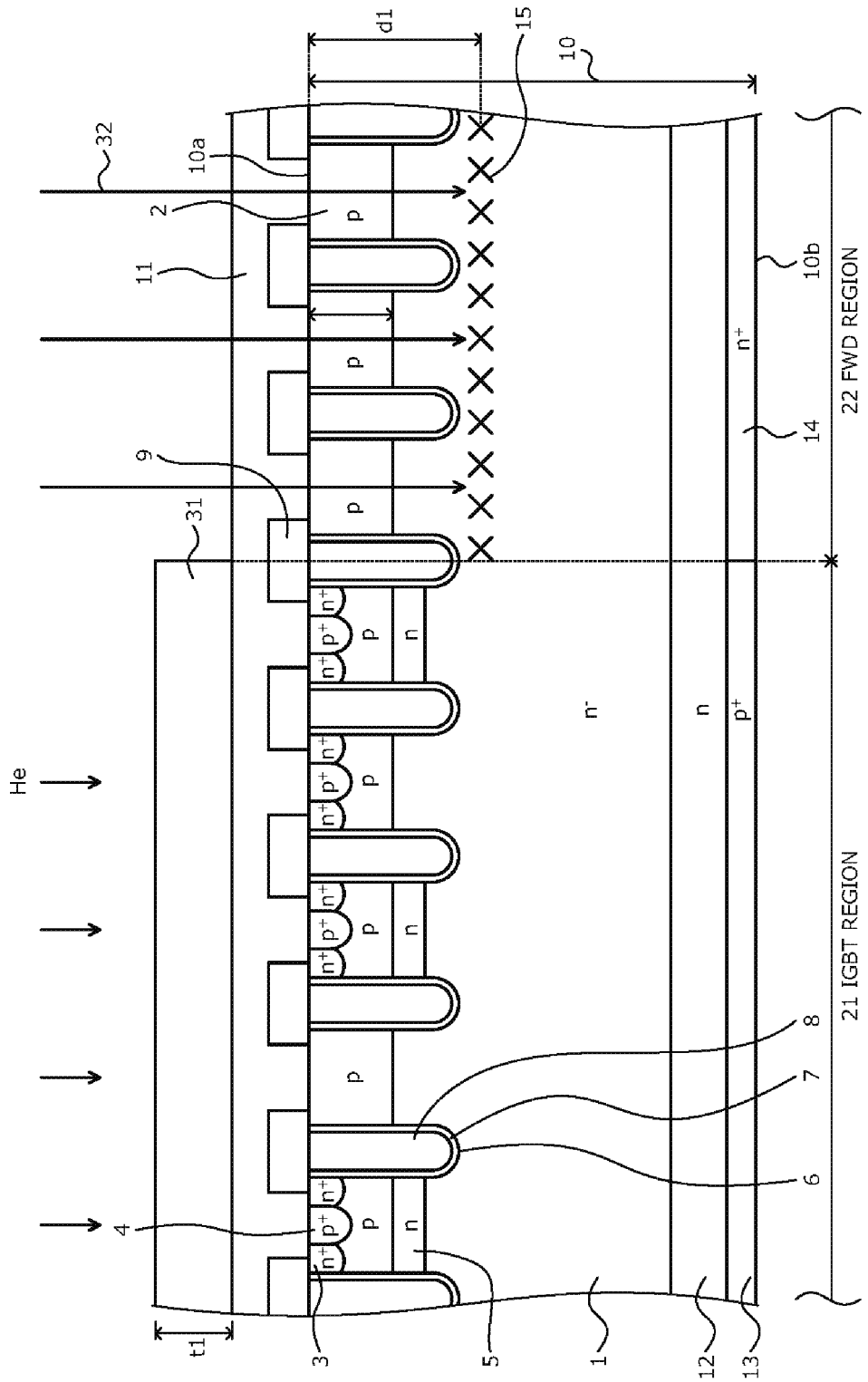
FIG. 1 is a cross-sectional view of a semiconductor device according to an embodiment during manufacture.

Problems associated with the conventional techniques will be discussed. First, since the hard mask 131 is mechanically processed by cutting or wire cutting, accuracy of the position of the opening 131a is degraded. Further, the smallest processing dimension of the opening 131a of the hard mask 131 is about 300 μm, which is large. As a result, reductions in the size of the semiconductor regions are difficult and due to device dimension, use is impossible. Further, the precision of the alignment of the semiconductor wafer 110 and the hard mask 131 is about ±50 μm, which is inferior compared to the alignment precision (about ±0.3 μm) of the photoresist film 121 formed by photolithography. Therefore, a large design margin has to be provided and the chip size increases, whereby the number of chips that may be cut from one semiconductor wafer decreases, increasing the cost.

On the other hand, when the photoresist film 121 is used as a shielding film and the depth of the ion implantation 122 of the impurity is increased, as described above, the photoresist film 121 has to be formed to have the thickness t101 corresponding to the range of the impurity to be implanted by the ion implantation 122. For example, the range in the photoresist film 121 is made to be twice the range in the semiconductor wafer 110. At this time, when the depth of the impurity implanted into the semiconductor wafer 110 by the ion implantation 122 is 0.5 μm, the thickness t101 of the photoresist film 121 is 1.0 μm. However, when the depth of the impurity implanted into the semiconductor wafer 110 by the ion implantation 122 is made deeper, for example, 50 μm, the thickness t101 of the photoresist film 121 has to be 100 μm or more.

Figure 16:
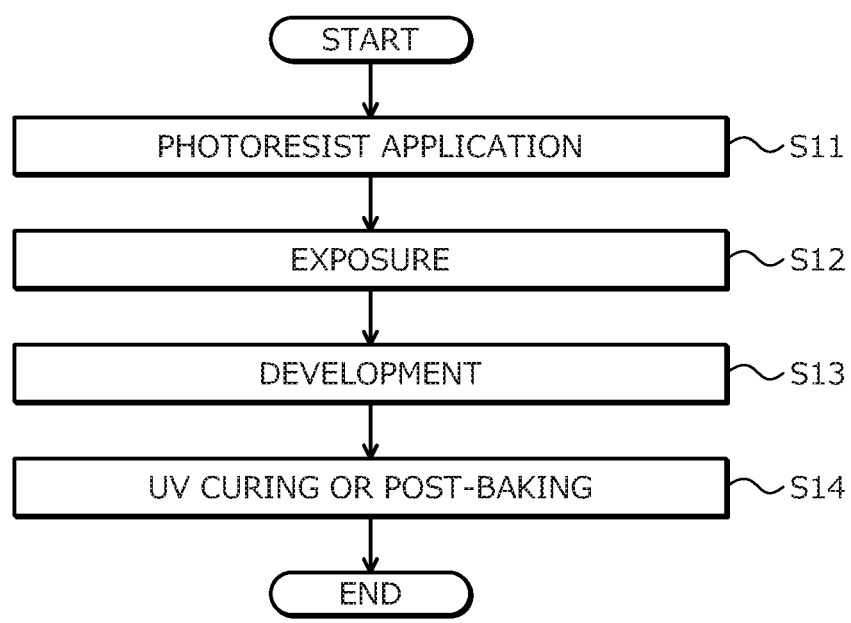
FIG. 16 is a flowchart of an outline of processes in a portion of a conventional method of manufacturing a semiconductor device.

When the thickness t101 of the photoresist film (resist mask) 121 used as shielding film is made thicker in this manner, the following problem arises. FIG. 16 is a flowchart of an outline of processes in a portion of a conventional method of manufacturing a semiconductor device. When the photoresist film 121 is formed, a photoresist is applied to a first main surface 110a of the semiconductor wafer 110, forming the photoresist film 121 having the predetermined thickness t101 on the entire first main surface 110a of the semiconductor wafer 110 (step S11). Next, exposure (step S12), and development (step S13) are performed. Exposed parts of photoresist are removed by the development, forming a resist pattern in the photoresist film 121.

Figure 17:
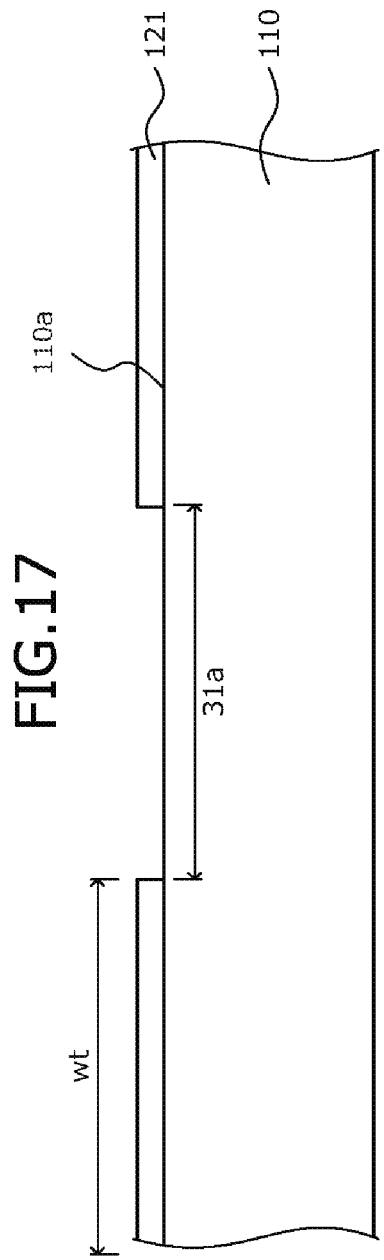
FIG. 17 is a cross-sectional view of a resist pattern without collapsed ends.

Next, to prevent foaming of solvents, etc. in the photoresist film 121 by the increased temperature during ion implantation, ultraviolet (UV) curing or post baking is performed (step S14). FIG. 17 is a cross-sectional view of a resist pattern without collapsed ends. In instances of such resist patterns, ions are implanted only in an opening 31a of the photoresist film 121.

Figure 18:
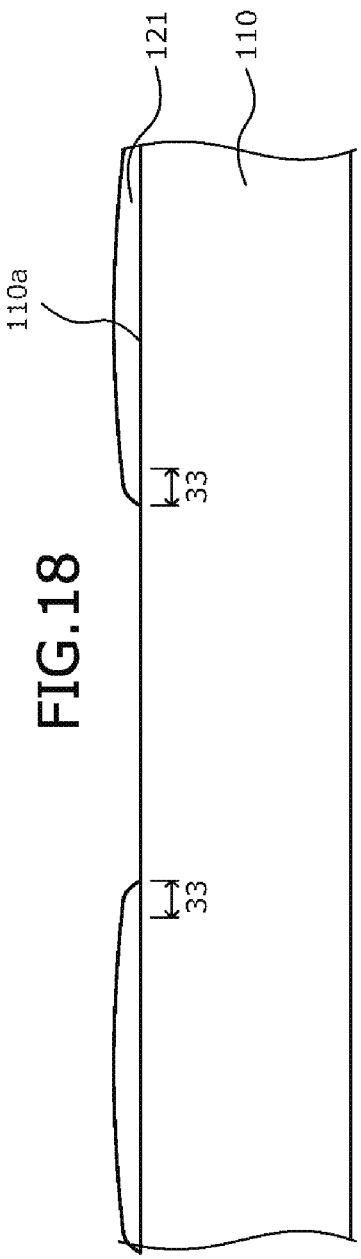
FIG. 18 is a cross-section view of a resist pattern with collapsed ends.

Nonetheless, when a remaining width wt (width of the photoresist film 121 not removed by the development) of the resist pattern is 10 μm or more, a collapse of ends of the resist pattern occurs due to the UV curing (or post baking). FIG. 18 is a cross-section view of a resist pattern with collapsed ends. In such cases, at ends of the resist pattern, since the desired thickness is not maintained, the ions are not blocked, whereby the ions are also implanted in parts 33 other than that corresponding to the opening 31a of the photoresist film 121. For example, in a RC-IGBT, the helium is also irradiated in regions in which the helium should be blocked and IGBT characteristics vary. Therefore, it is necessary to limit the dose, accelerating voltage upon irradiation, and the irradiated ion species and perform the helium irradiation without performing baking after development, or a large design margin has to be provided.

Figure 19:
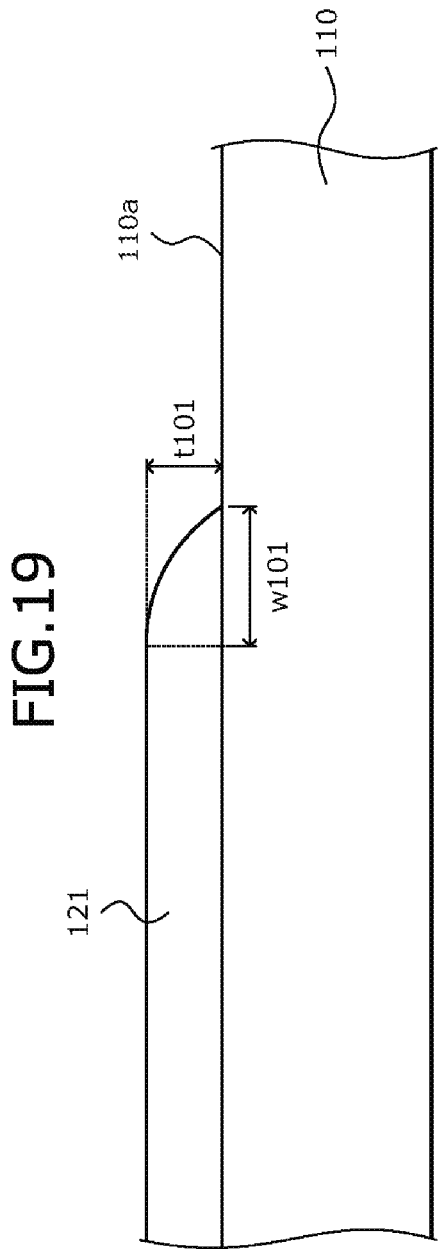
FIG. 19 is a cross-sectional view depicting a collapse width of a resist pattern edge.
Figure 20:
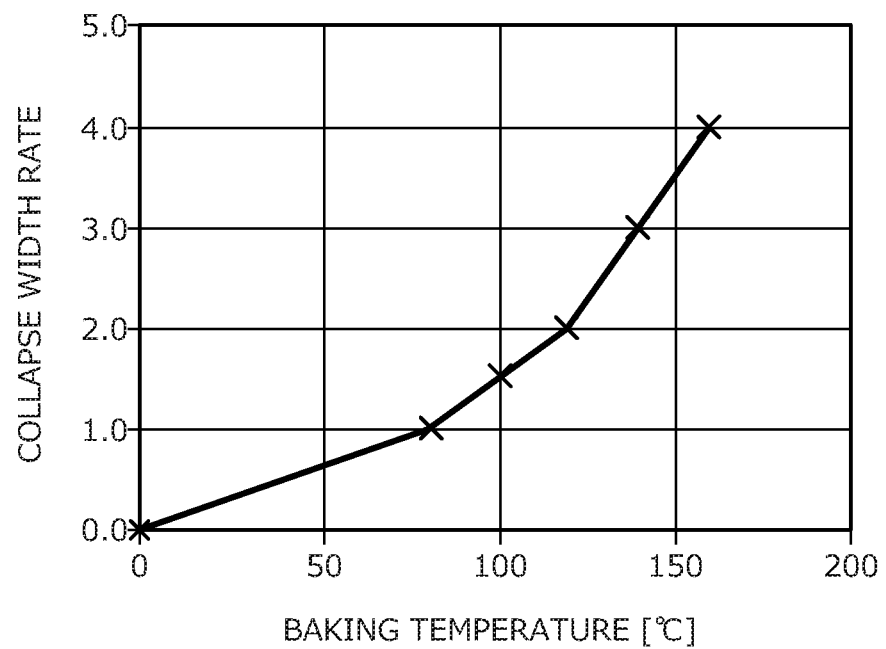
FIG. 20 is a graph of a relationship of baking temperature and the collapse width of the resist pattern edge.

FIG. 19 is a cross-sectional view depicting a collapse width of a resist pattern edge. A collapse width w101 is a length from a resist pattern edge until the thickness of the photoresist film 121 becomes the thickness t101. FIG. 20 is a graph of the relationship of baking temperature and the collapse width of the resist pattern edge. In FIG. 20, a horizontal axis represents baking temperature in units of degrees C.; a vertical axis represents collapse width rate. A mathematical product of the collapse width rate and the thickness t101 is the collapse width w101. For example, in a case where the thickness t101 of the photoresist film 121 is 50 μm and post baking is performed at 100 degrees C., the collapse width rate is 1.5 and therefore, the collapse width w101 is 50×1.5=75 μm. In this manner, when the photoresist film 121 is used as mask for helium irradiation, proton irradiation, or the like, the thickness t101 of the photoresist film 121 has to be increased and in this case, the collapse width w101 increases, whereby a large design margin covering this increase has to be provided, increasing manufacturing costs.

Embodiments of a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

Figure 2:
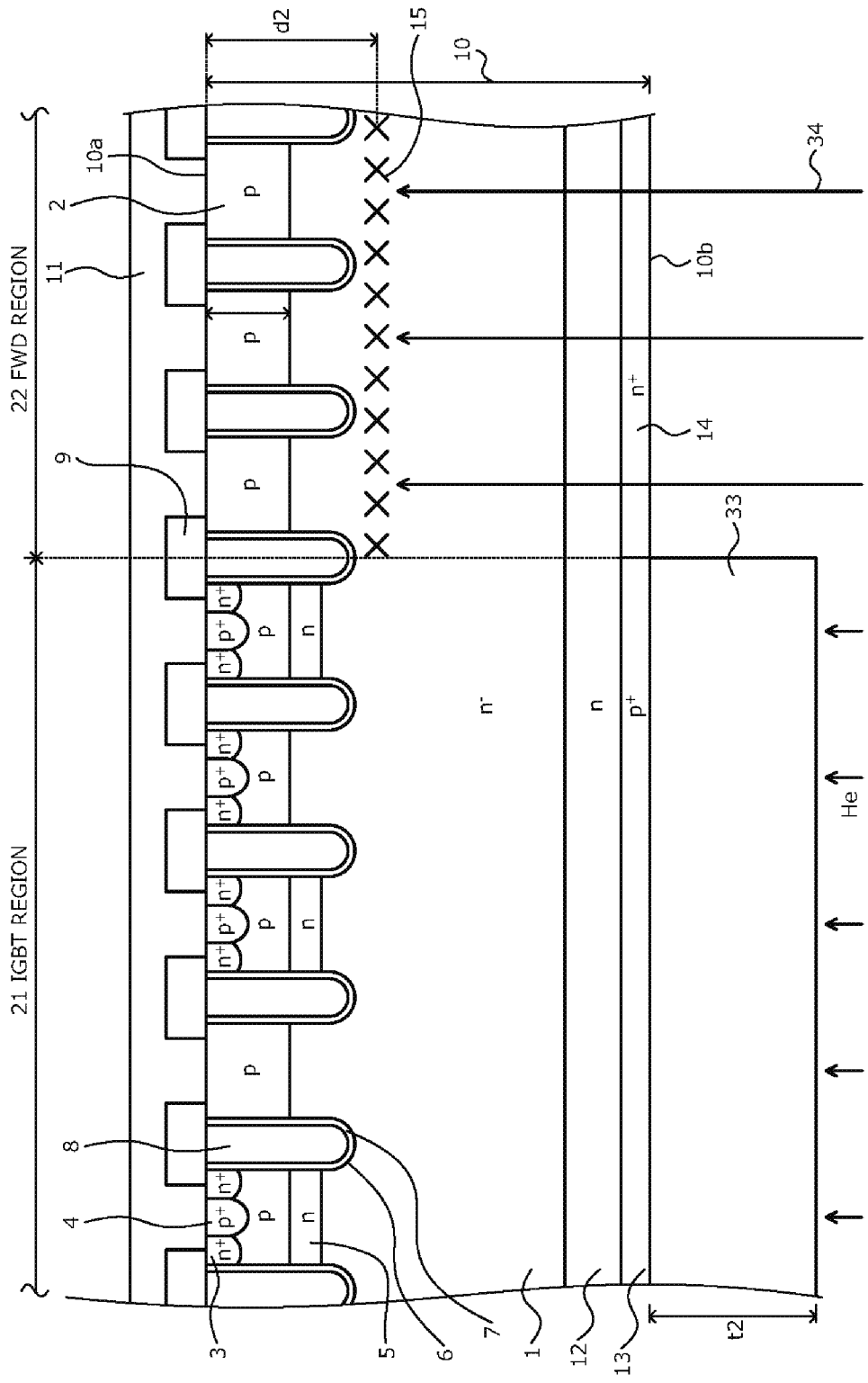
FIG. 2 is a cross-sectional view of another example a semiconductor device according to the embodiment during manufacture.

A method of manufacturing a semiconductor device according to an embodiment will be described taking, as an example, a 1200V RC-IGBT in which helium defects have been introduced in a FWD region by helium (He) irradiation. Breakdown voltage is the voltage of a limit that does not cause errant operation or destruction of an element. FIG. 1 is a cross-sectional view of a semiconductor device according to the embodiment during manufacture. FIG. 2 is a cross-sectional view of another example a semiconductor device according to the embodiment during manufacture. FIGS. 1 and 2 respectively depict a state during irradiation of helium from a front surface 10a side and a rear surface 10b side of a semiconductor wafer 10.

The RC-IGBT, for example, is constituted by an IGBT having a trench gate structure and a FWD connected in antiparallel with the IGBT integrally formed on a single semiconductor substrate (semiconductor chip). In particular, in an active region on the single semiconductor substrate, an IGBT region 21 constituting an operation region of the IGBT and an FWD region 22 constituting an operation region of the FWD are provided in parallel (refer to FIG. 1). The active region is a region in which current flows during an ON state. In an edge termination region (not depicted) surrounding a periphery of the active region, an edge termination structure such as a guard ring or field plate may be provided.

As depicted in FIG. 1, the semiconductor wafer 10 of an $n^-$-type and constituting an $n^-$-type drift region 1 is prepared. A material of the semiconductor wafer 10 may be silicon (Si). A material of the semiconductor wafer 10 may be may be silicon carbide (SiC). Hereinafter, a case where the semiconductor wafer 10 is a silicon wafer will be described as an example. An impurity concentration of the semiconductor wafer 10 may be of a range whereby, for example, resistivity becomes about 200 cm to 900 cm. The front surface 10a of the semiconductor wafer 10 may be, for example, a (001) plane. A thickness (thickness before backgrinding described hereinafter) of the semiconductor wafer 10 may be, for example, 725 μm.

Next, a process including photolithography and ion implantation as one set is recursively performed using different conditions to form in the front surface 10a side of the semiconductor wafer 10, a p-type base region 2, an $n^+$-type emitter region 3, and a $p^+$-type contact region 4 of the IGBT. The p-type base region 2 is formed on the entire surface of the active region in the IGBT region 21 and the FWD region 22. The p-type base region 2 also serves as a p-type anode region in the FWD region 22. The $n^+$-type emitter region 3 and $p^+$-type contact region 4 are selectively formed in the p-type base region 2 in the IGBT region 21.

Parts of the semiconductor wafer 10 excluding the p-type base region 2, an n-type field stop (FS) layer 12, a $p^+$-type collector region 13, and an $n^+$-type cathode region 14 described hereinafter constitute the $n^-$-type drift region 1. In the IGBT region 21, an n-type accumulation layer 5 may be formed between the $n^-$-type drift region 1 and the p-type base region 2. The n-type accumulation layer 5 becomes a minority carrier (hole) barrier of the $n^-$-type drift region 1 at turn-on of the IGBT, and has a function of accumulating minority carriers in the $n^-$-type drift region 1.

Next, the front surface 10a of the semiconductor wafer 10 is thermally oxidized, forming in the edge termination region, a field oxide film covering the front surface 10a of the semiconductor wafer 10. Next, by photolithography and etching, in the IGBT region 21, a trench 6 penetrating the $n^+$-type emitter region 3, the p-type base region 2, and the n-type accumulation layer 5 to reach the $n^-$-type drift region 1 is formed. The trench 6, as viewed from the front surface 10a side of the semiconductor wafer 10, for example, is arranged in a striped layout extending in a direction (Z axis in FIG. 1) orthogonal to a direction (X axis in FIG. 1) along which the IGBT region 21 and the FWD region 22 are arranged.

Further, the trench 6 is further formed in the FWD region 22, in a same layout as that in the IGBT region 21. In the FWD region 22, the trench 6 penetrates the p-type base region 2 (p-type anode region) and reaches the $n^-$-type drift region 1. Next, for example, a gate insulating film 7 is formed along inner walls of the trench 6 by thermal oxidation. Next, on the front surface 10a of the semiconductor wafer 10, a poly-silicon (poly-Si) layer is formed so as to be embedded in the trench 6. Next, the poly-silicon layer, for example, is etched, leaving a part thereof constituting the gate electrode 8 in the trench 6.

The p-type base region 2, $n^+$-type emitter regions 3, $p^+$-type contact regions 4, the trenches 6, the gate insulating films 7, and the gate electrodes 8 constitute a MOS gate having a trench gate structure. The $n^+$-type emitter regions 3, the $p^+$-type contact regions 4, and the n-type accumulation layers 5 may be formed after formation of the gate electrodes 8. The $n^+$-type emitter region 3 suffices to be arranged in at least one mesa region between adjacent trenches 6 and a mesa region in which no $n^+$-type emitter region 3 is arranged may be present. Further, the $n^+$-type emitter region 3 may be selectively arranged at predetermined intervals along the direction in which the trenches 6 extend in a striped shape.

Next, on the front surface 10a of the semiconductor wafer 10, an interlayer insulating film 9 is formed so as to cover the gate electrodes 8. Next, the interlayer insulating film 9 is patterned, forming contact holes penetrating the interlayer insulating film 9 in a depth direction. The depth direction is a direction from the front surface 10a of the semiconductor wafer 10 toward the rear surface 10b. In the contact holes of the IGBT region 21, the $n^+$-type emitter regions 3 and the $p^+$-type contact regions 4 are exposed. In the contact holes in the FWD region 22, the p-type base region 2 is exposed.

Next, on the interlayer insulating film 9, a front electrode 11 is formed so as to be embedded in the contact holes. In the IGBT region 21, the front electrode 11 is electrically connected with the p-type base region 2, the $n^+$-type emitter regions 3 and the $p^+$-type contact regions 4, and functions as an emitter electrode. Further, in the FWD region 22, the front electrode 11 is electrically connected with the p-type base region 2 and functions as an anode electrode. The front electrode 11 needs not be connected with the p-type base region 2 in mesa regions in which no $n^+$-type emitter region 3 is arranged.

Next, the semiconductor wafer 10 is ground (back-grinding) from the rear surface 10b side, to a position obtaining a product thickness (for example, about 115 µm) for use as a semiconductor device. In the case of a breakdown voltage of 1200V, the product thickness for use as a semiconductor device is, for example, about 110 µm to 150 µm. Next, a process including photolithography and ion implantation as one set is recursively performed using different conditions to form the n-type field stop layer 12 and the $n^+$-type cathode region 14 on the rear surface 10b side of the semiconductor wafer 10.

The $n^+$-type cathode region 14 is formed in a surface layer of the rear surface 10b of the semiconductor wafer 10 after grinding, and entirely covers the rear surface 10b of the semiconductor wafer 10. The n-type field stop layer 12 is formed at a position deeper than that of the $n^+$-type cathode region 14 from the rear surface 10b of the ground semiconductor wafer 10. The n-type field stop layer 12 is formed in at least the IGBT region 21 and the FWD region 22. The n-type field stop layer 12 may be in contact with the $n^+$-type cathode region 14.

Next, by photolithography and ion implantation, a part of the $n^+$-type cathode region 14 corresponding to the IGBT region 21 is changed to a $p^+$-type, whereby the $p^+$-type collector region 13 is formed. In other words, the $p^+$-type collector region 13 is in contact with the $n^+$-type cathode region 14, along a direction orthogonal to the direction along which the IGBT region 21 and the FWD region 22 are arranged (for example, Z axis in FIG. 1). The $p^+$-type collector region 13 may contact the n-type field stop layer 12 in the depth direction. Next, on the front surface 10a of the semiconductor wafer 10, a passivation film is formed so as to cover the edge termination region.

Next, on the front surface 10a of the semiconductor wafer 10, a photoresist film 31 having an opening at a part thereof corresponding to the FWD region 22 is formed. The photoresist film 31 is used as a mask (shielding film) to perform helium irradiation 32 of a deep range (for example, about 8 µm or more) by a high acceleration energy (for example, about 3.0 eV or more) and introduce (form) in the $n^-$-type drift region 1, defects 15 of helium to become lifetime killers. The defects 15 of helium are introduced near a border of the $n^-$-type drift region 1 with the p-type base region 2 (p-type anode region). An implantation depth (range) d1 of the helium is, for example, about 8 µm from the front surface 10a of the semiconductor wafer 10.

When the implantation depth d1 of the helium is about 8 µm from the front surface 10a of the semiconductor wafer 10, to cause the photoresist film 31 to function as a shielding film, a thickness t1 of the photoresist film 31 is about 33 µm or more. As a result, the defects 15 are introduced only in the FWD region 22 without an introduction of the defects 15 in the IGBT region 21 covered by the photoresist film 31. Conditions of the helium irradiation 32 from the front surface 10a of the semiconductor wafer 10 may be set as, for example, a dose of about $1\times10^{10}/cm^2$ to $1\times10^{13}/cm^2$, and an acceleration energy of about 3.0 MeV to 4.5 MeV.

The photoresist film 31 is removed by an ashing process (ashing). Processes from the formation of the photoresist film 31 through the helium irradiation 32 to removal of the photoresist film 31 will be described in detail hereinafter. Next, a rear electrode (not depicted) is formed on the entire rear surface 10b of the semiconductor wafer 10. The rear electrode is in contact with the p+-type collector region 13 and the n+-type cathode region 14. The rear electrode further functions as a collector electrode and as a cathode electrode. Thereafter, the semiconductor wafer 10 is cut into individual chips (diced) thereby, completing the RC-IGBT chip (semiconductor chip).

The helium irradiation 32 may be performed before the interlayer insulating film 9 is formed on the front surface 10a of the semiconductor wafer 10. In this case, in the helium irradiation 32, the high acceleration energy is 2.0 MeV or higher and the range is about 8 μm. In this case, the interlayer insulating film 9 is formed on the front surface 10a of the semiconductor wafer 10 after the photoresist film 31 is removed by an ashing process (ashing).

In place of the helium irradiation 32 from the front surface 10a of the semiconductor wafer 10, helium irradiation 34 may be performed from the rear surface 10b of the semiconductor wafer 10 (refer to FIG. 2). In this case, a photoresist film 33 having an opening at a part thereof corresponding to the FWD region 22 is formed on the rear surface 10b of the semiconductor wafer 10. The photoresist film 33 may be used as a mask (shielding film) to perform the helium irradiation 34 and form in the n−-type drift region 1, the defects 15 of helium to become lifetime killers. An implantation depth (range) d2 of the helium from the rear surface 10b of the semiconductor wafer 10 is, for example, about 100 μm.

In this manner, when the implantation depth d2 of the helium is about 100 μm from the rear surface 10b of the semiconductor wafer 10, to cause the photoresist film 33 to function as a shielding film, a thickness t2 of the photoresist film 33 is about 220 μm or more. As a result, similarly to the helium irradiation 32, the defects 15 are introduced only in the FWD region 22 from the front surface 10a of the semiconductor wafer 10 without introduction of the defects 15 in the IGBT region 21 covered by the photoresist film 33. Conditions of the helium irradiation 34 from the rear surface 10b of the semiconductor wafer 10 may be set as, for example, a dose of about $1 \times 10^{10}/cm^2$ to $1 \times 10^{13}/cm^2$, and an acceleration energy of about 10 MeV to 25 MeV.

Figure 3:
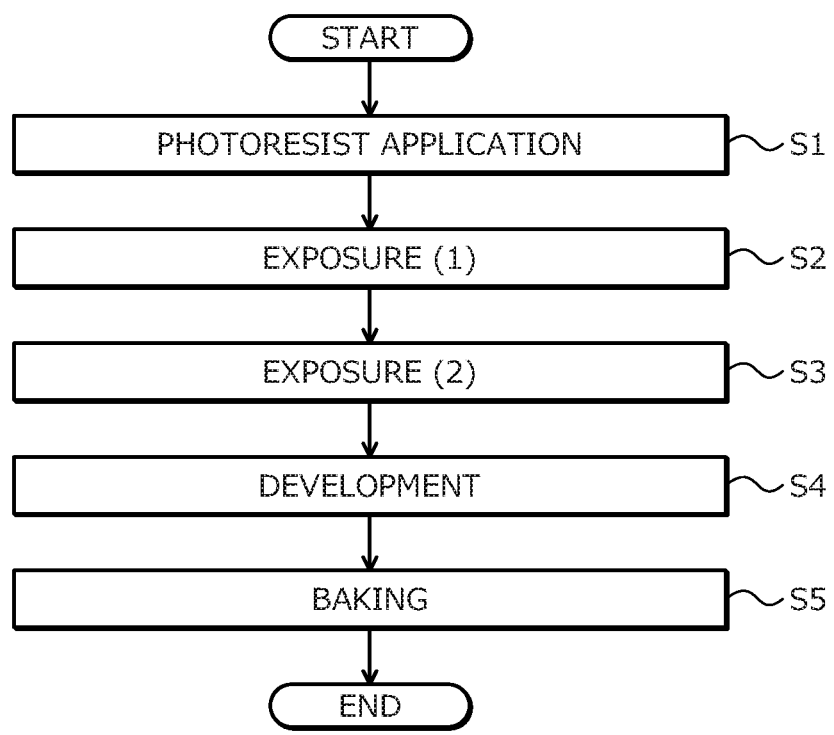
FIG. 3 is a flowchart of an outline of processes in a portion of a method of manufacturing a semiconductor device according to the embodiment.
Figure 4:
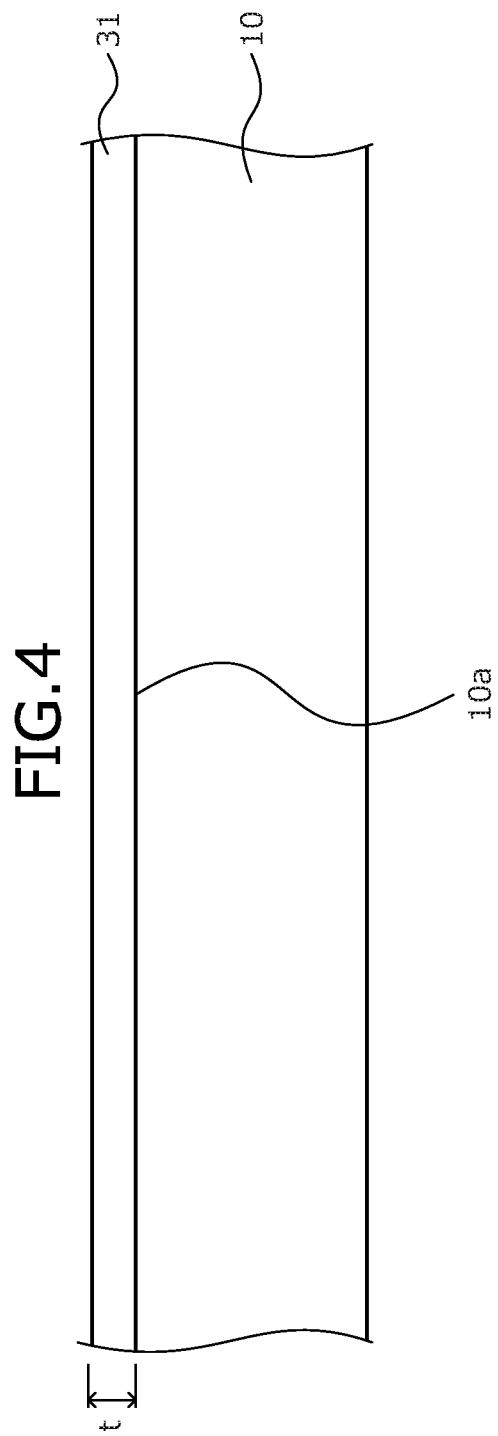
FIGS. 4, 5, 6, 7, and 8 are cross-section views of semiconductor device during manufacture according to a portion of the method of manufacturing a semiconductor device of the embodiment.
Figure 5:
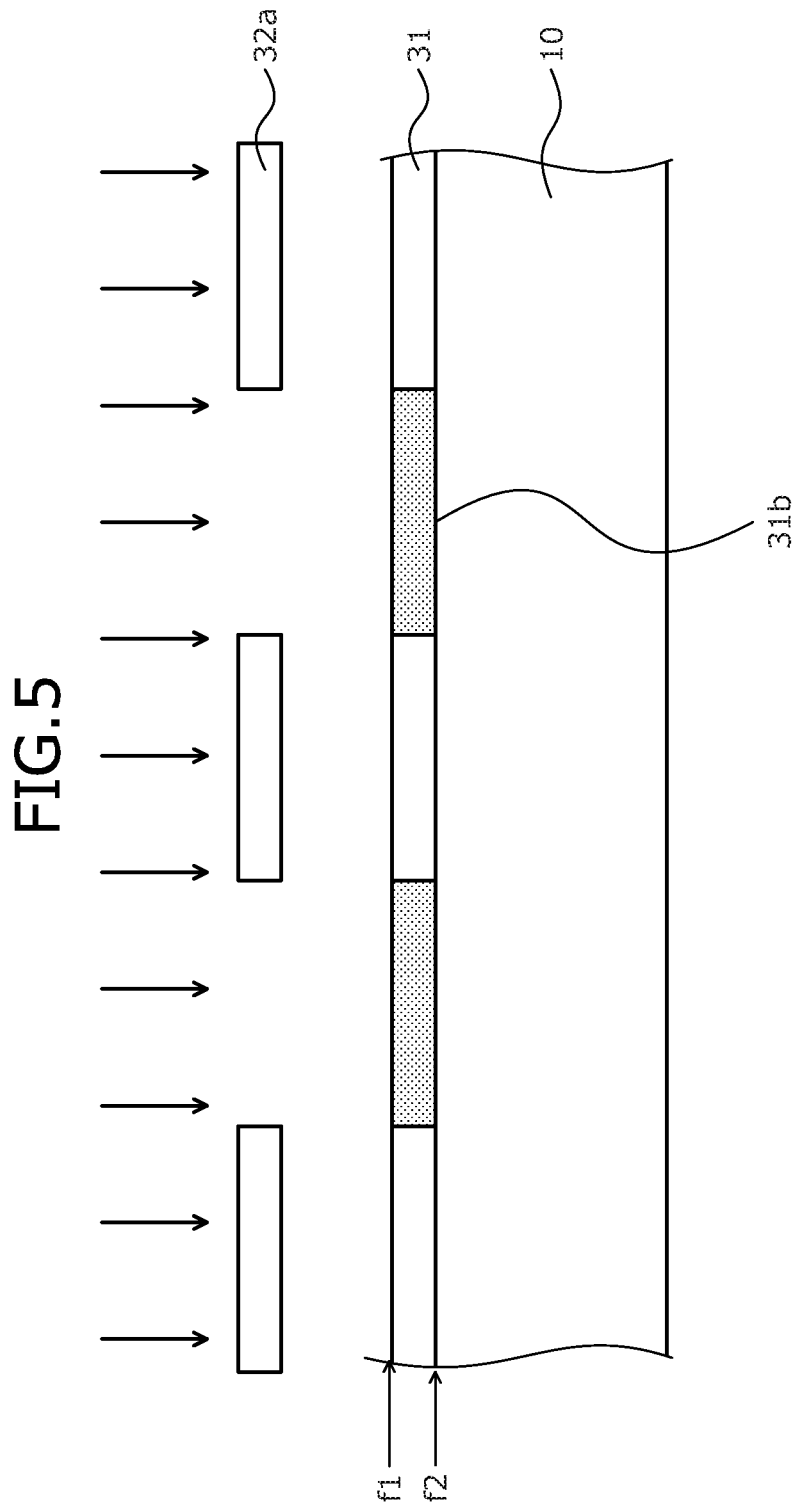
Figure 6:
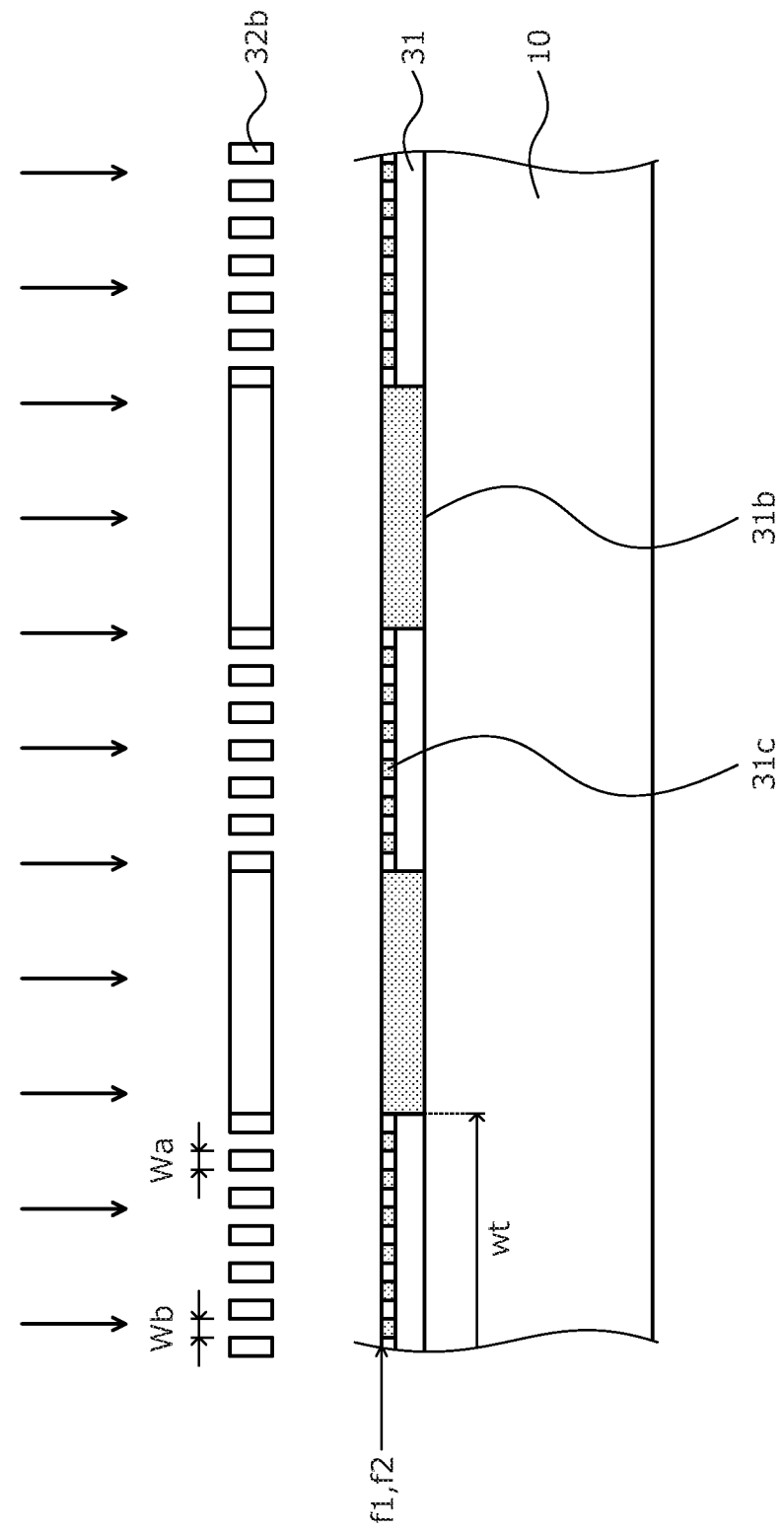

Processes performed from the formation to the removal of the photoresist film (resist mask) 31 will be described taking, as an example, a case where the helium irradiation 32 is performed from the front surface 10a of the semiconductor wafer 10. FIG. 3 is a flowchart of an outline of processes in a portion of the method of manufacturing a semiconductor device according to the embodiment. FIG. 3 sequentially depicts the gist of the processes performed from the formation to the removal of the photoresist film 31. FIGS. 4, 5, 6, 7, and 8 are cross-section views of semiconductor device during manufacture according to a portion of the method of manufacturing a semiconductor device of the embodiment. FIGS. 4 to 8 respectively depict states at steps S1 to S5 in FIG. 3.

First, for example, the semiconductor wafer 10 is placed in a spin coater (coating machine) and a photoresist is applied to (dripped onto) the front surface 10a of the semiconductor wafer 10. The semiconductor wafer 10 is rotated, whereby the photoresist is spread on the entire front surface 10a of the semiconductor wafer 10, forming the photoresist film 31 on the entire front surface 10a of the semiconductor wafer 10 (step S1).

At step S1, the photoresist film 31 is formed to have a predetermined thickness t necessary for use of the photoresist film 31 as a shielding film in the helium irradiation 32 described hereinafter. For example, application of the photoresist may be repeated 2 or more times to obtain the predetermined thickness t of the photoresist film 31. It suffices to obtain the predetermined thickness t of the photoresist film 31 and as a material of the photoresist film 31, any one of a positive and a negative photoresist may be used, a chemically amplified photoresist may be used. A chemically amplified photoresist is a photosensitive material that is a mixture of a resin, an acid generator, and a solvent, and that easily responds to light compared to an ordinary photoresist. Since the thicker the photoresist film 31 is, the longer the exposure time becomes, a chemically amplified photoresist may be used as a material of the photoresist film 31.

Thereafter, the semiconductor wafer 10 may be place in/on a heating device such as a hot plate equipped with a heat source, whereby the semiconductor wafer 10 is heated overall (hereinafter, dry baking) to evaporate solvents, water, etc. in the photoresist film 31 and thereby, dry and fix the photoresist film 31. A temperature of the dry baking may be, for example, about 80 degrees C. to 150 degrees C. Thereafter, a part of the photoresist film 31 having a predetermined width from the edge may be dissolved and removed from the entire perimeter along the edge of the photoresist film 31.

Next, the semiconductor wafer 10 is placed on a stage of a stepper (exposure equipment) and one at a time, the entire surface of the semiconductor wafer 10 is exposed to light through a mask (reticle) 32a while scanning is performed, whereby a mask pattern having an opening at a predetermined location is transferred to the photoresist film 31 (step S2).

Here, a predetermined location is a region through which ions are to pass by ion implantation using the photoresist film 31. For example, in the case of the semiconductor device depicted in FIG. 1, the predetermined region corresponds to the FWD region 22 through which the helium is to pass. Further, at the time of exposure, a focus set value f2 is set for a rear surface (surface in contact with the semiconductor wafer 10) of the photoresist film 31 with respect to a focus reference position f1 of the stepper. The focus deviates from the surface by the thickness of the photoresist film 31, whereby a part from the surface of the photoresist film 31 corresponding to a predetermined location to the rear surface is exposed.

Next, a mask 32b having a location for an opening different from that of the mask 32a is set in the stepper, while the entire surface of the semiconductor wafer 10 is scanned one at a time, exposure through the mask 32b is performed, whereby a mask pattern having an opening at the predetermined location is transferred to the photoresist film 31 (step S3).

The exposure at step S3 is performed to prevent collapse since collapse of the edges of the resist pattern occurs due to the UV curing (or post baking) when the remaining width wt of the resist pattern is 10 μm or more. A predetermined location here is a part that is not photosensitive by the exposure at step S2. A width Wb of the opening is smaller than the remaining width wt of the resist pattern and, for example, the width Wb of the opening may be 1 μm to 3 μm. Further, the opening of the mask 32b is arranged at an interval Wa that is about the same as the width Wb of the opening. In other words, the opening of the mask 32b arranged in a row, at the interval Wa. Further, the interval Wa may be 1 μm to 3 μm.

At the time of this exposure, a wavelength and intensity of the light used in the exposure is the same as those at step S2. However, the condition of the depth of the exposure differs from that at step S2. For example, the focus set value f2 is set for the surface of the photoresist film 31 with respect to the focus reference position f1 of the stepper. The focus does not deviate from the surface, whereby a part of the surface of the photoresist film 31 corresponding to a predetermined location is exposed.

Next, after performing a post exposure bake (PEB), the photoresist film 31 is developed by a developer (developing machine), whereby a predetermined location is removed, forming a resist mask (step S4). Here, the predetermined location is a part 31b exposed at step S2 and a part 31c exposed at step S3. At the part 31b exposed at step S2, the photoresist film 31 is removed, forming an opening 35. Further, at the part 31c exposed at step S3, openings 36 are arranged on the photoresist film 31 not exposed at step S2, the openings 36 being shallower than the opening 35 formed at step S2 on a part of the resist pattern having the remaining width wt. The part 31b exposed at step S2 and the part 31c exposed at step S3 are formed to be separated from each other. As a result, at a side face 41 (side face of the opening 35) of the remaining width wt of the resist pattern, a remaining width A (protrusion) described hereinafter is formed, enabling a collapse width w1 of the side face 41 of the remaining width wt of the resist pattern to be decreased.

Here, although development is performed after the exposure at step S2 and step S3, after step S2, development may be performed and only the part exposed at step S2 may be removed followed by performing step S3 and again performing development.

Figure 7:
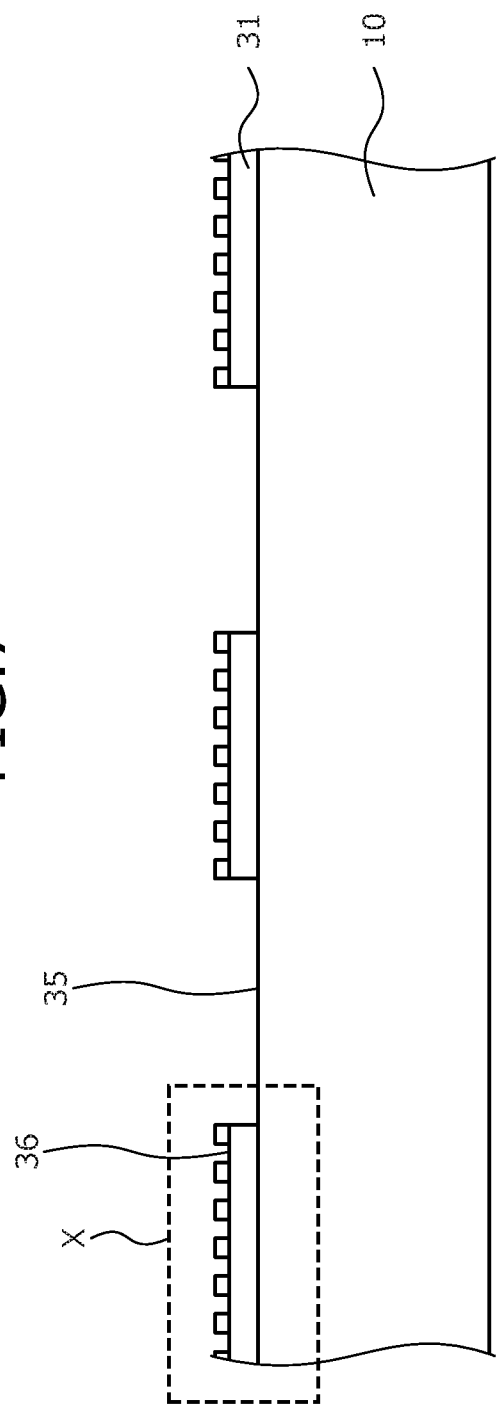
Figure 8:
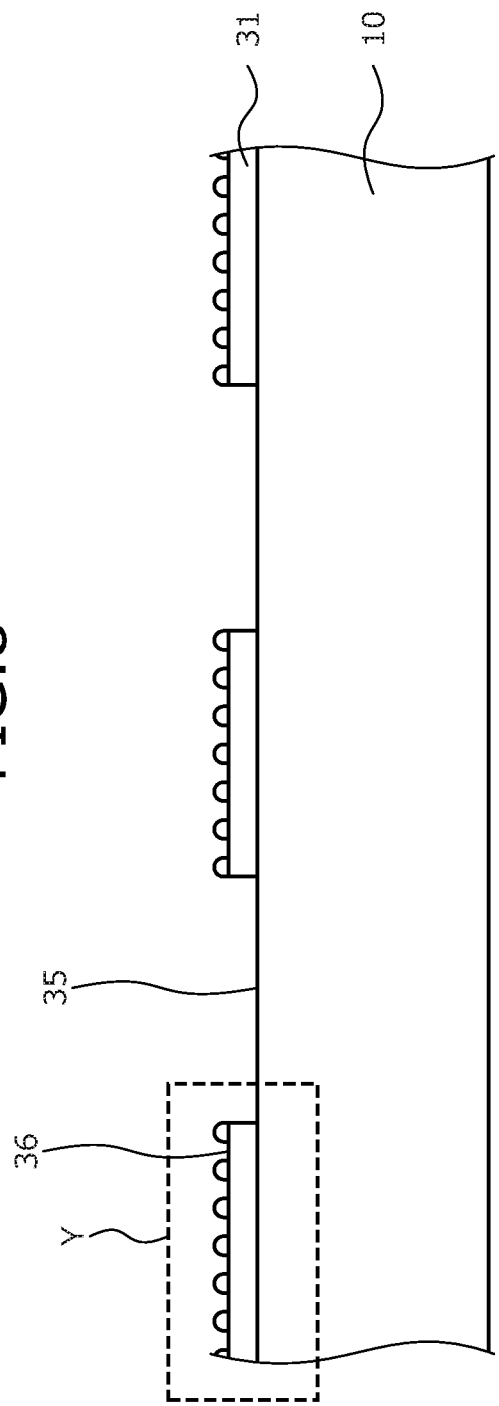
Figure 9:
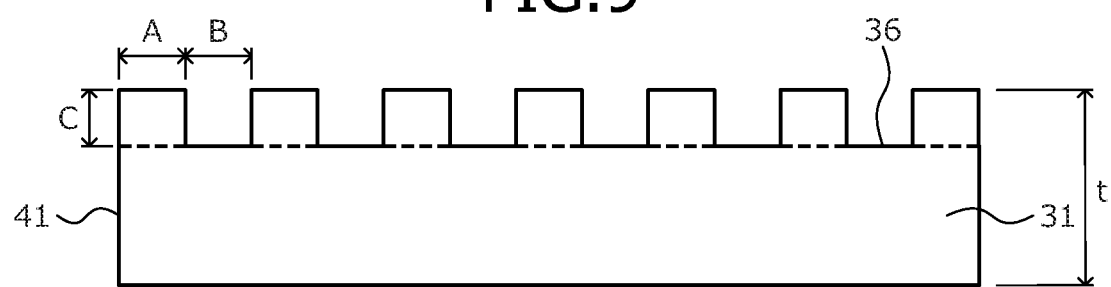
FIG. 9 is an expanded view of a part indicated by X in FIG. 7.

FIG. 9 is an expanded view of a part indicated by X in FIG. 7. At step S3, the mask 32b, which has openings that are arranged at a narrow interval Wb and the width Wb that is narrow is used to expose parts of the surface of the photoresist film 31, whereby microscopic recesses and protrusions are formed on the photoresist film 31. At the microscopic recesses and protrusions, the remaining width A has a width from 1 μm to 3 μm, a same as the interval Wa of the openings; and an opening width B has a width from 1 μm to 3 μm, a same as the width Wb of the openings. Further, in the exposure at step S3, when a step C is deep, ions pass easily from the part of the opening width B during ion implantation and therefore, the thickness t of the photoresist film 31 has to be thick. When the thickness t of the photoresist film 31 is thick, the exposure at step S2 takes time and throughput becomes poor. Therefore, the step C may be 0.5 μm to 1 μm. As a result, in the surface of the photoresist film 31 having the thickness t, the openings 36 having a width that is the opening width B and a depth that is the step C are formed.

Figure 10:
FIG. 10 is an expanded view of a part indicated by Y in FIG. 8.
Figure 11:
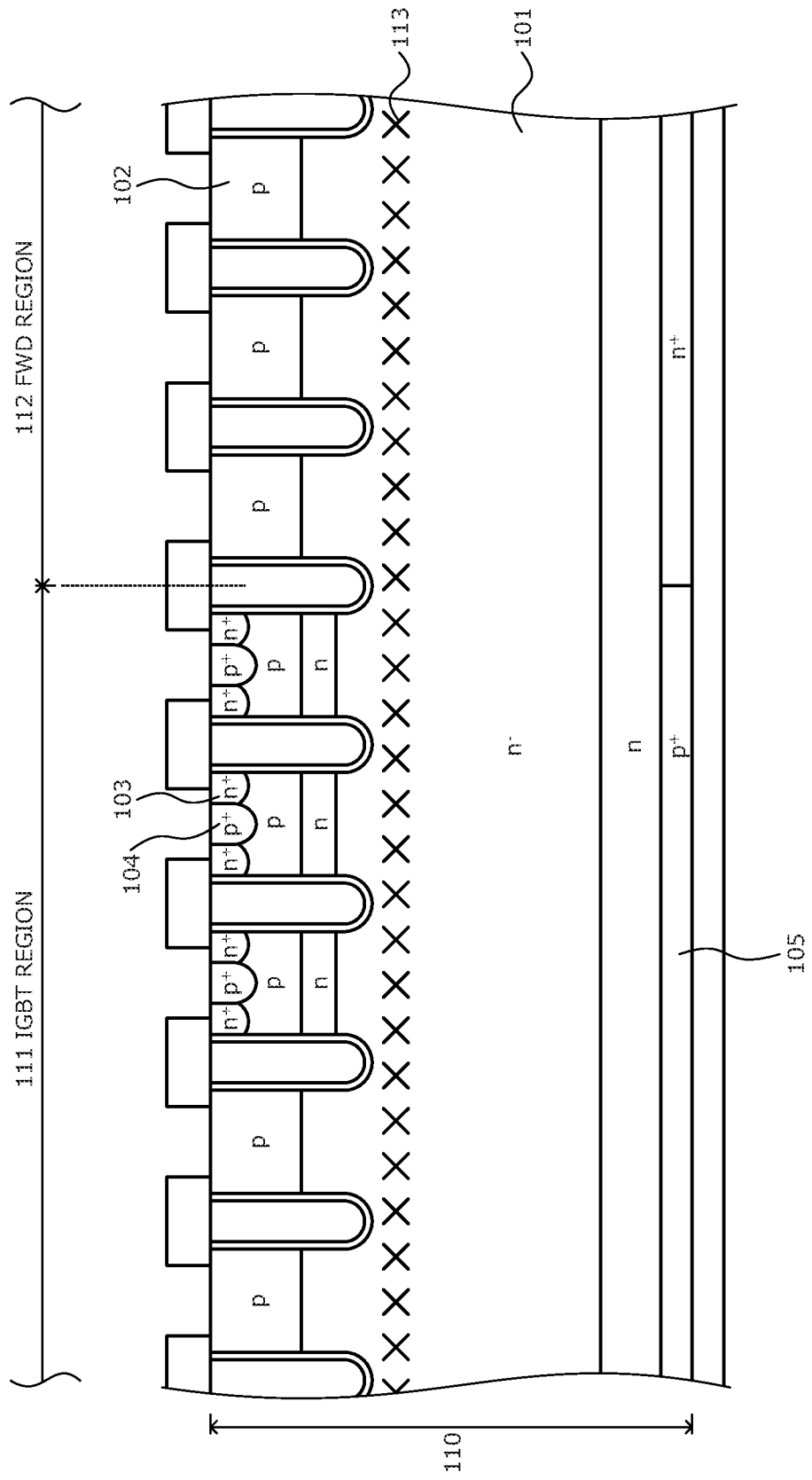
FIGS. 11 and 12 are cross-sectional views of a structure of a conventional RC-IGBT.
Figure 12:
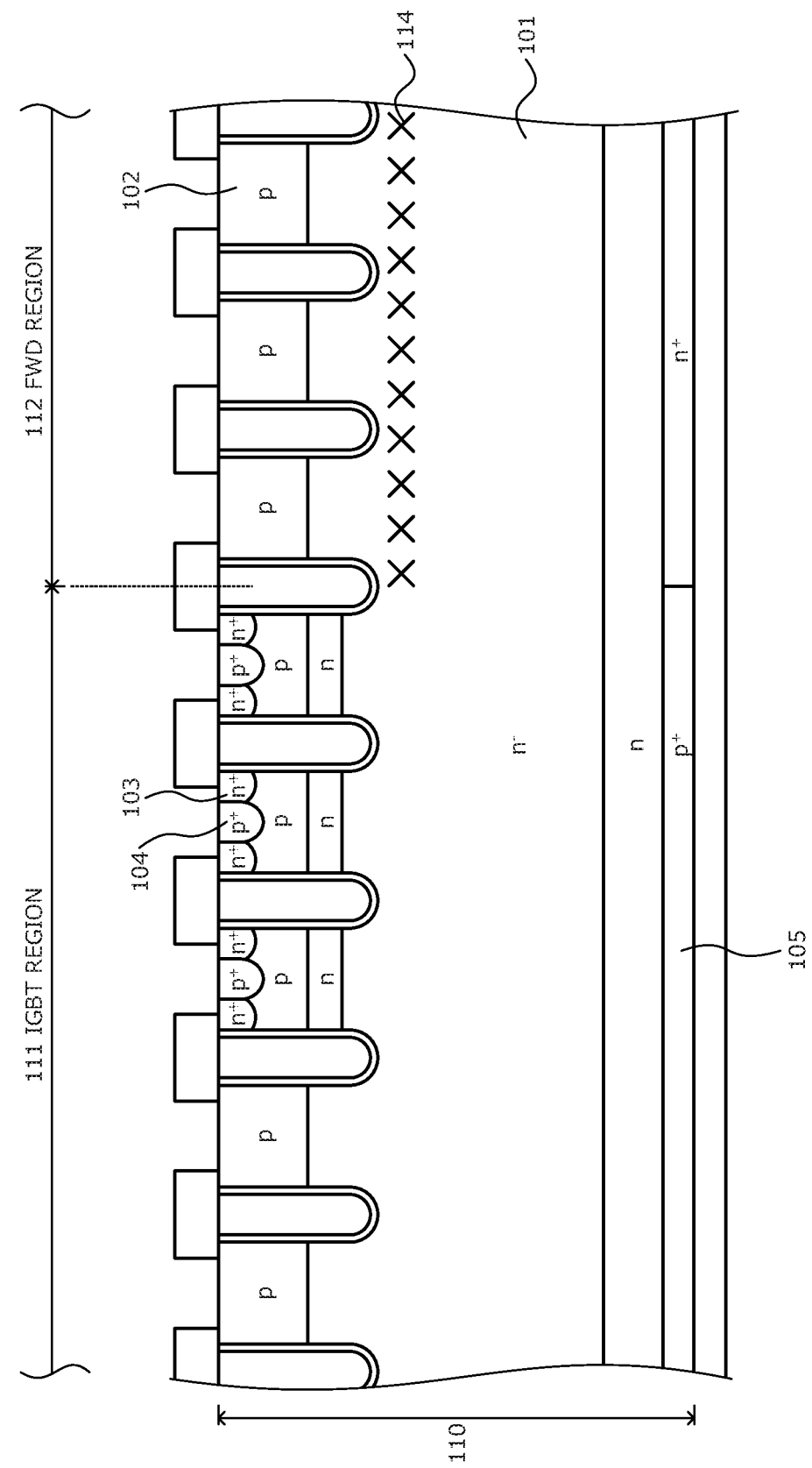
Figure 13:
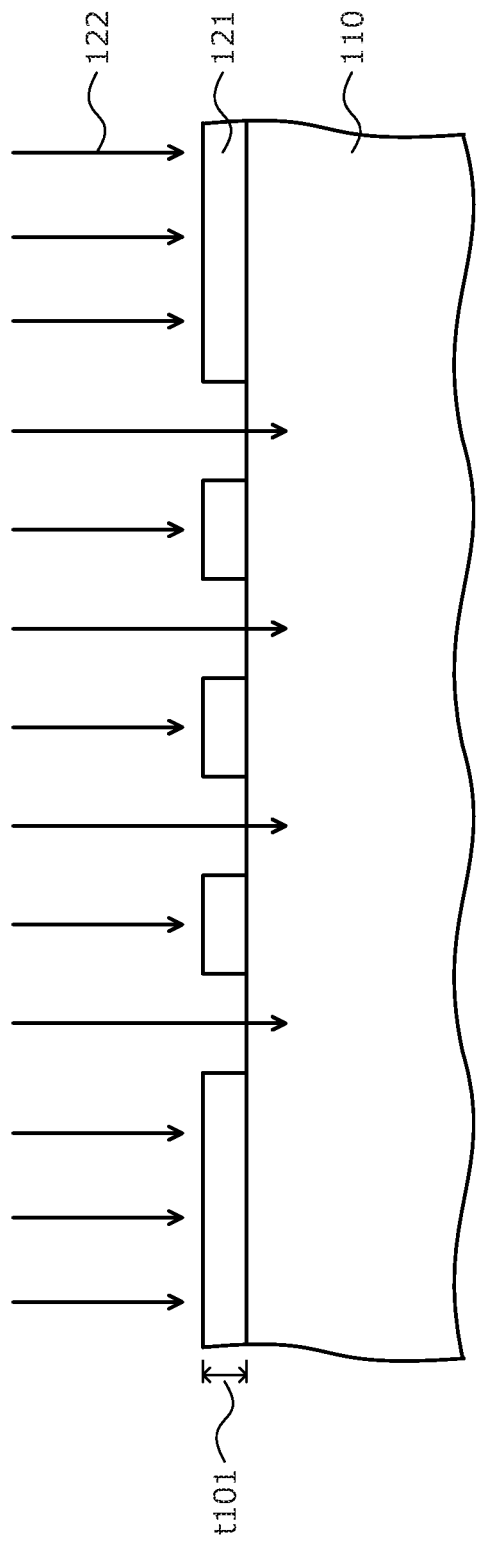
FIG. 13 is a cross-sectional view schematically depicting a state when ion implantation is performed using a photoresist film.
Figure 14:
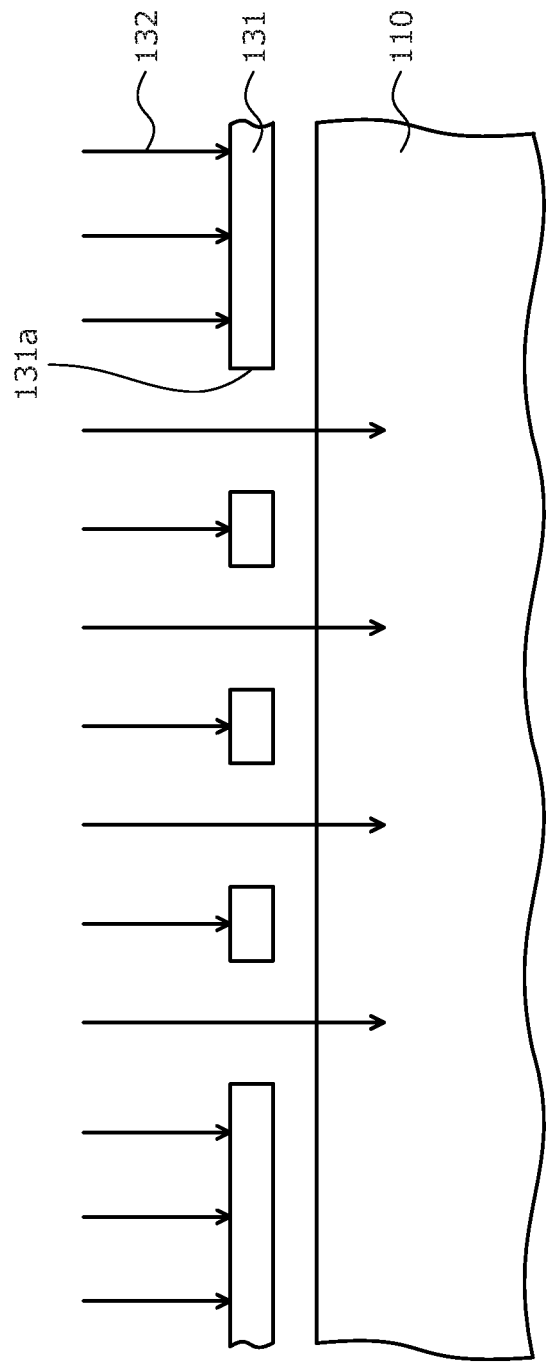
FIGS. 14 and 15 are cross-sectional views during ion implantation using a hard mask as a mask.
Figure 15:
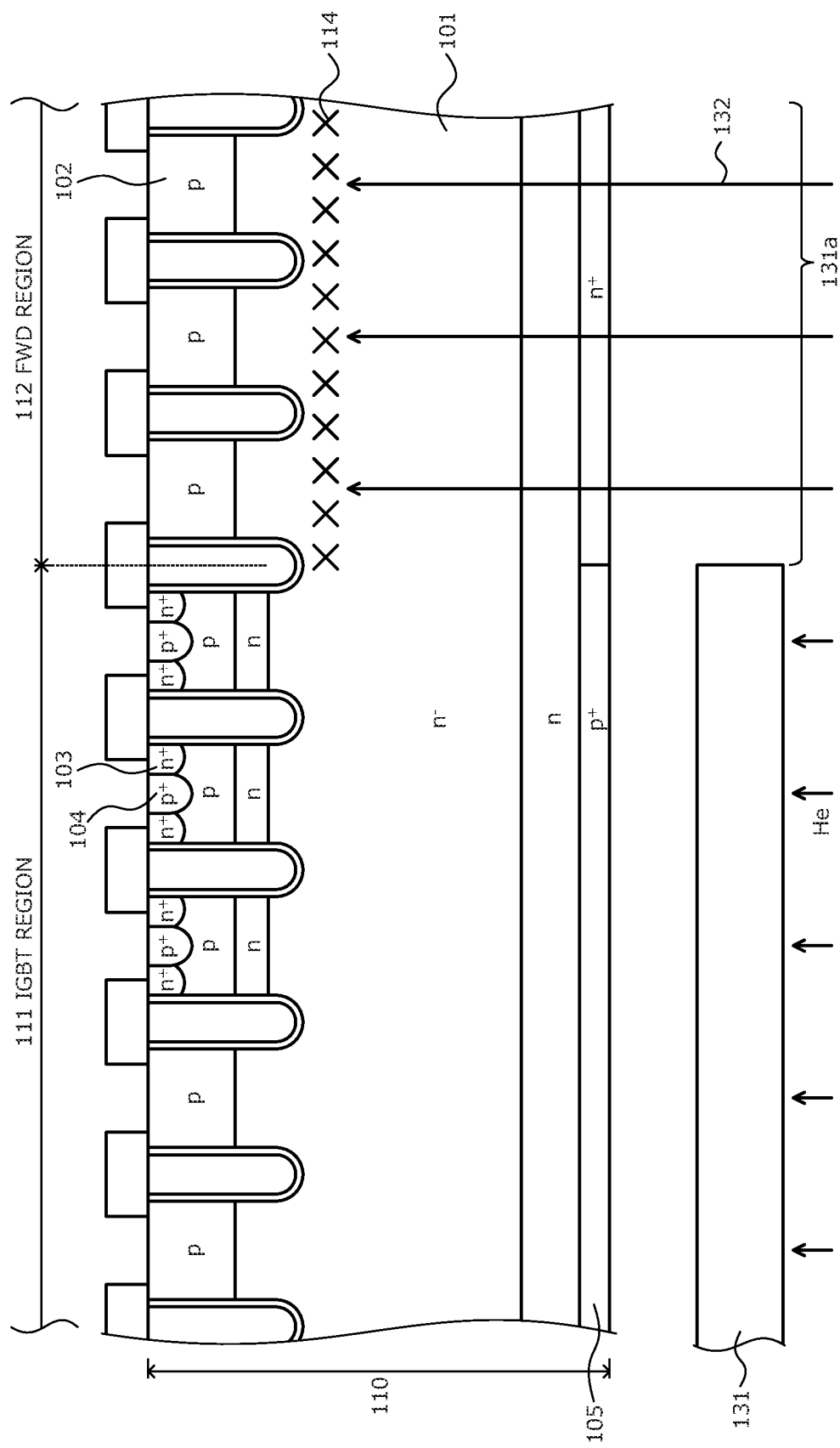

Next, the substrate is baked (step S5). For example, the baking temperature may be 150 degrees C. Collapse at the resist pattern edge occurs due to the baking. FIG. 10 is an expanded view of a part indicated by Y in FIG. 8. Since microscopic recesses and protrusions are formed on the top of the photoresist film 31, collapse occurs at the protrusions. Therefore, the collapse width w1 is half of the remaining width A, which is the width of the protrusions. In the embodiment, since the width of the protrusions is narrow, the collapse width w1 is also narrow.

Here, although the narrower the remaining width A is, the smaller the collapse width w1 is, when the remaining width A is too narrow, collapse occurs overall, not only the protrusions, whereby the collapse width w1 becomes large. Therefore, the remaining width A may be about 1 μm or more. Further, when the remaining width A is increased, the collapse width w1 increases and therefore, the remaining width A may be about 3 μm or less. When the remaining width A is more than 3 μm, the collapse width w1 may be more than half that (1.5 μm), becoming larger than the alignment precision of the photoresist film 31, requiring the design margin for that amount to be provided.

Further, when the step C is too deep, ions pass during the ion implantation and effects as a mask are not obtained; and therefore, the step C may be 1 μm or less. When the step C is shallow, collapse occurs overall, not just at the protrusions, whereby the collapse width w1 increases; and therefore, the step C may be 0.5 μm or more.

Since the thickness necessary for blocking depends on the ion species, variation of the thickness of the photoresist film 31 is necessary. However, the remaining width A is not dependent on the ion species to be implanted. For example, a maximum value and a minimum value for helium and for protons are as described above. Further, in the embodiment, the collapse width w1 is dependent on the widths of the recesses and protrusions and is not dependent on the thickness of the photoresist film 31. Therefore, the thickness of the photoresist film 31 may be made thick.

As described, according to the embodiment, by using a resist mask in ion implantation that uses high acceleration energy, as compared to a case where a hard mask is used, a minimum processing dimension of the mask opening may be reduced and the precision of alignment with the semiconductor wafer may be enhanced. In particular, the minimum processing dimension of an opening for a hard mask is about 300 μm. In contrast, the minimum processing dimension of an opening for the resist mask is about the same as the thickness of the resist mask and at most is about 220 μm (refer to FIG. 2). The alignment precision of the semiconductor wafer and the resist mask is better than the alignment precision of the semiconductor wafer and a hard mask. Therefore, a predetermined impurity may be implanted in a predetermined region with high precision. Further, at the time of device design, the design margin may be reduced, enabling the chip size to be reduced. As a result, the number of chips that may be cut from one semiconductor wafer increases, enabling the unit cost of the product to be reduced and the cost to be reduced.

Further, according to the embodiment, when the remaining width wt of the resist pattern is 10 μm or more, the microscopic recesses and protrusions are formed on top of the resist mask. As a result, collapse due to baking after development occurs at the protrusions. Since the width of the protrusions is narrow, the collapse width is also narrow. Thus, in the embodiment, since the collapse width is no longer dependent on the thickness of the resist mask, a thick resist mask may be used. Therefore, even when the remaining width wt of the resist pattern is 10 μm or more, a resist mask may be used in ion implantation that uses high acceleration energy.

Figure 21:
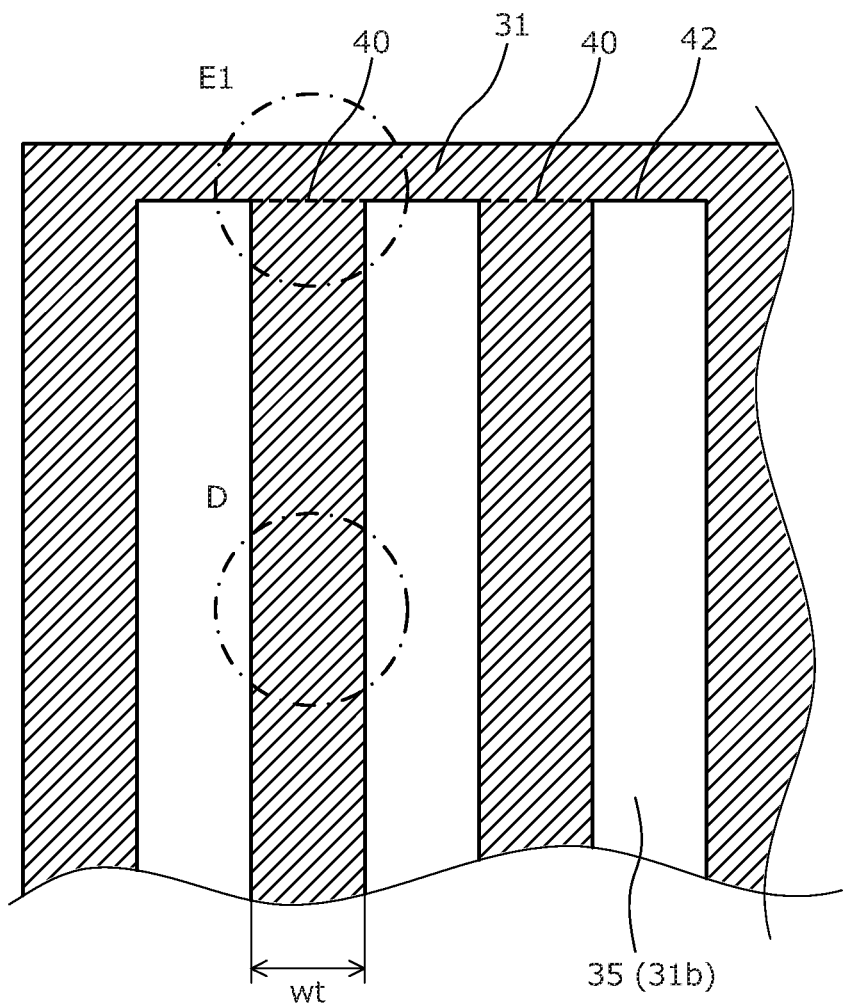
FIGS. 21 and 22 depict a part of a planar shape of a resist mask.
Figure 22:
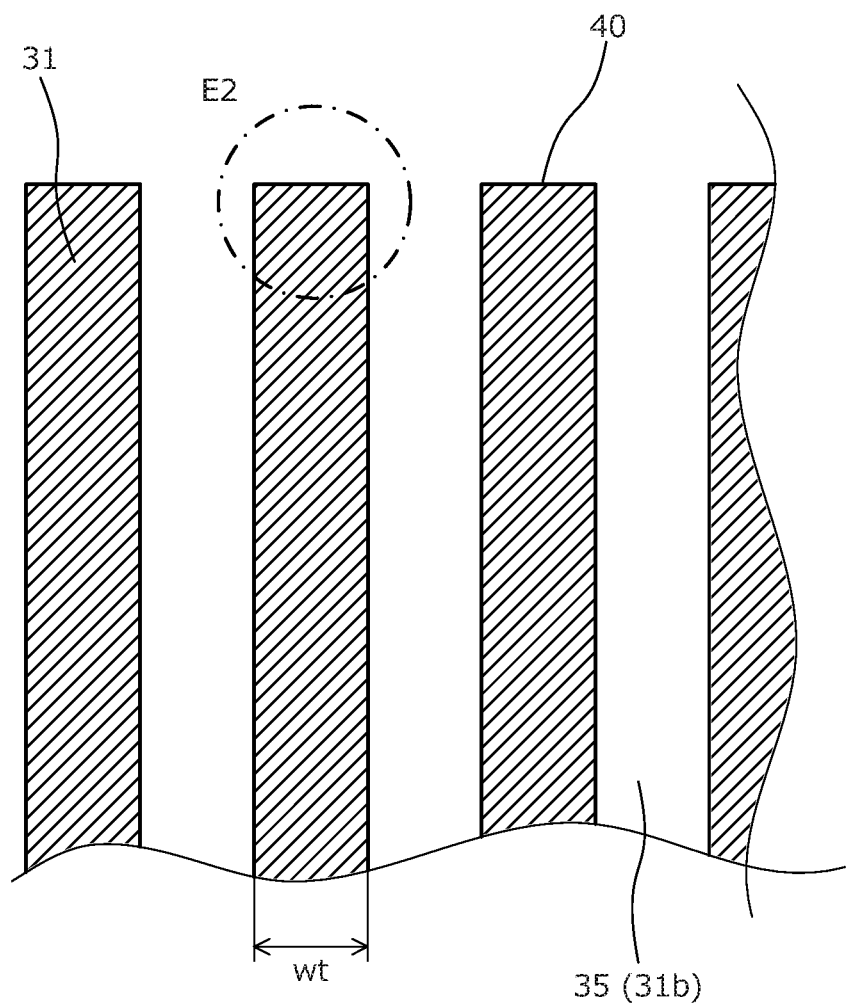

FIGS. 21 and 22 depict a part of a planar shape of the resist mask. In FIG. 21, an end 40 of the remaining width wt of the resist pattern is connected with the photoresist film 31. In FIG. 22, the end 40 of the remaining width wt of the resist pattern is not connected with the photoresist film 31. As depicted in FIG. 21, when the end 40 of the remaining width wt of the resist pattern is connected with the photoresist film 31, collapse of an end 42 of the opening 35 of the resist pattern may be prevented. When ion implantation is not performed at a border of the end 42 of the opening 35 of the resist pattern and the end 40 of the remaining width wt of the resist pattern, the planar shape is that depicted in FIG. 21; and when ion implantation may be performed at the border of the end 42 of the opening 35 of the resist pattern, the planar shape depicted in FIG. 22 may be used.

Figure 23A:
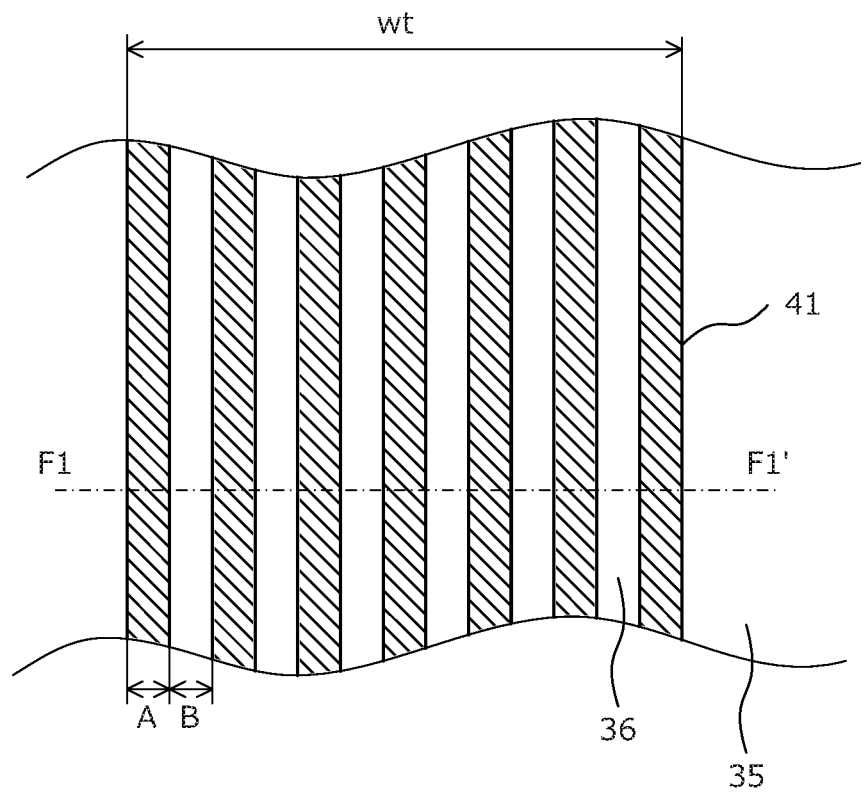
FIG. 23A is an enlarged view of a part indicated by D in FIG. 21.
Figure 23B:
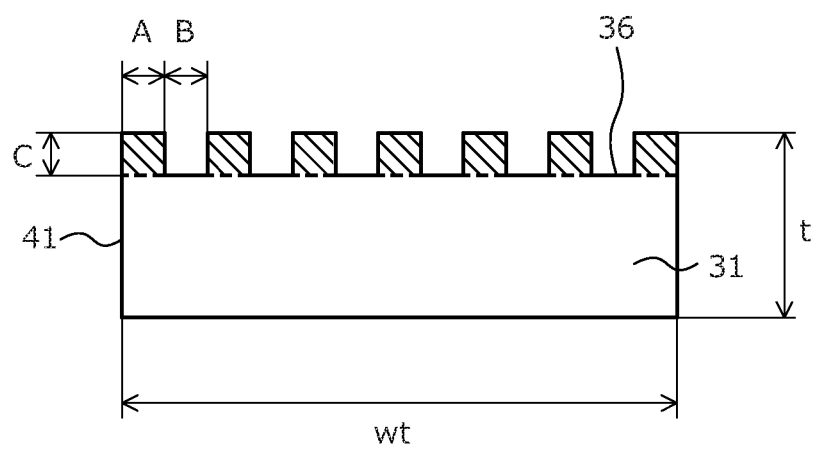
FIG. 23B is a cross-sectional view at F1-F1' in FIG. 23A.

FIG. 23A is an enlarged view of a part indicated by D in FIG. 21. FIG. 23B is a cross-sectional view at F1-F1' in FIG. 23A. In FIG. 23A, the part having the remaining width A is indicated by hatching. The opening 36 has a striped shape along a direction vertical to a width direction of the opening width B. Further, the opening 36 is not formed at the side face 41 of the remaining width wt of the resist pattern. As a result, the collapse width w1 of the side face 41 of the remaining width wt of the resist pattern may be reduced.

Figure 24A:
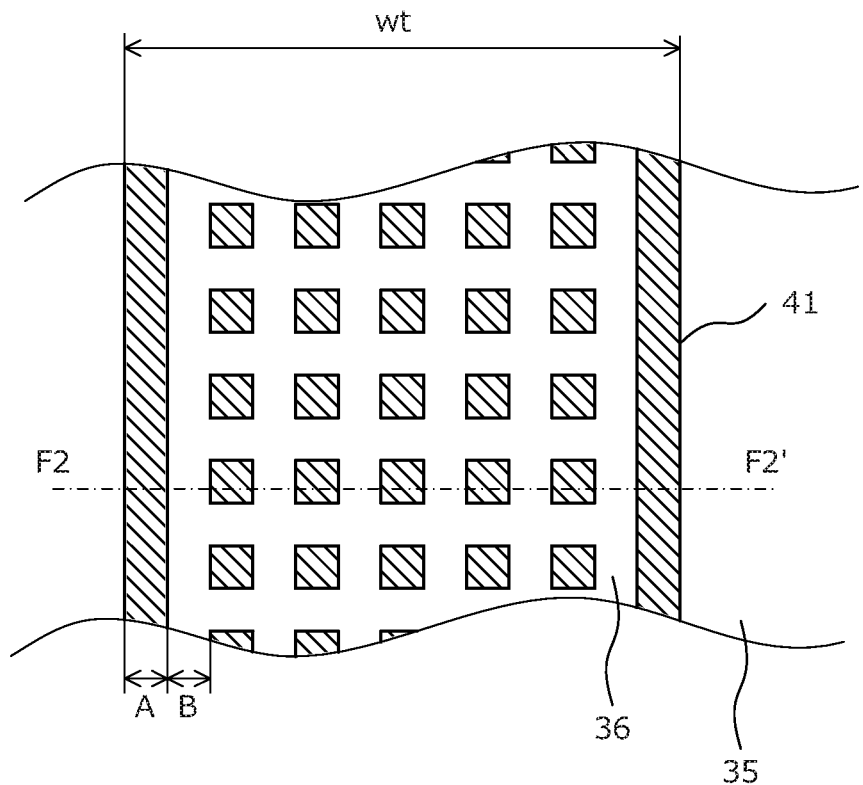
FIG. 24A is an enlarged view of a part indicated by D in FIG. 21.
Figure 24B:
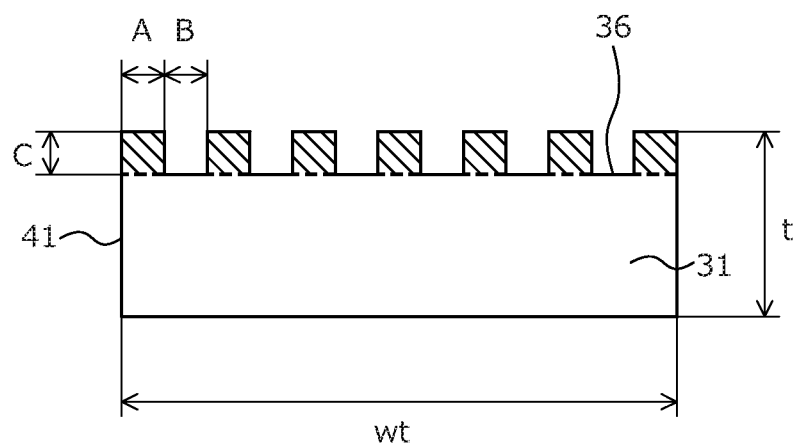
FIG. 24B is a cross-sectional view at F2-F2' in FIG. 24A.

FIG. 24A is an enlarged view of a part indicated by D in FIG. 21. FIG. 24B is a cross-sectional view at F2-F2' in FIG. 24A. In FIG. 24A, the part having the remaining width A is indicated by hatching. Although the opening 36 is formed in a lattice-like shape, the opening 36 is not formed at the side face 41 of the remaining width wt of the resist pattern. Further, although the lattice is depicted to have a square planar shape, the shape may be rectangular. As a result, the collapse width w1 of the side face 41 of the remaining width wt of the resist pattern may be reduced.

Figure 25A:
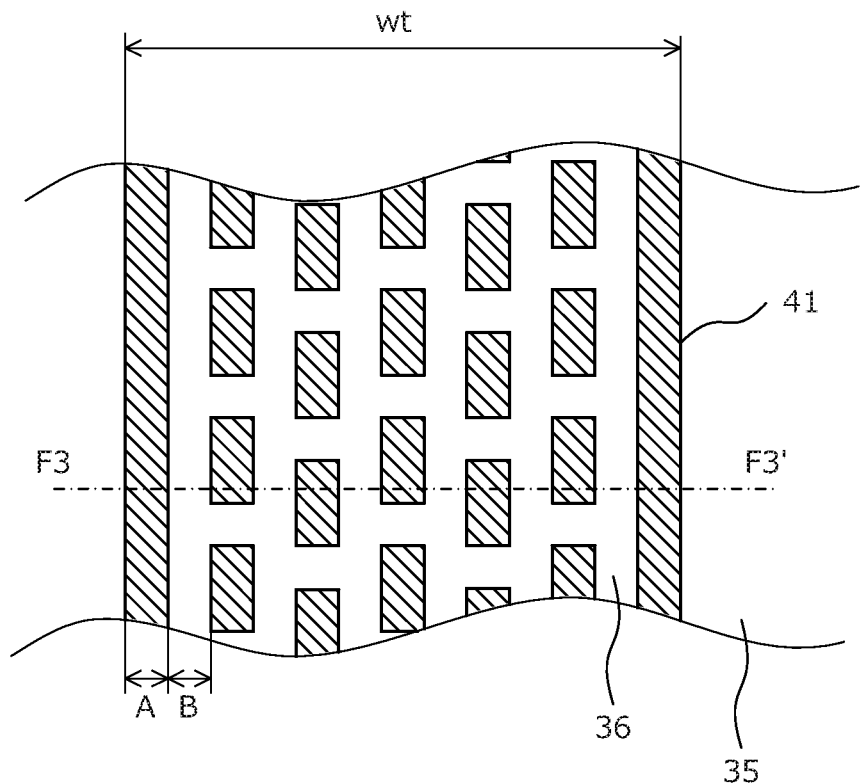
FIG. 25A is an enlarged view of a part indicated by D in FIG. 21.
Figure 25B:
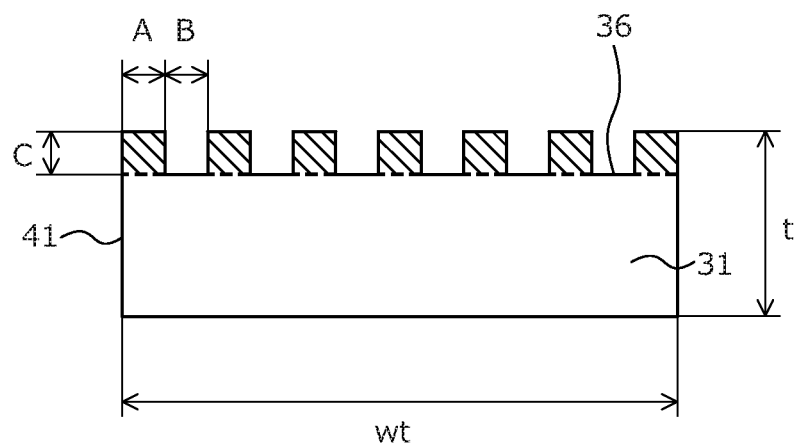
FIG. 25B is a cross-sectional view at F3-F3' in FIG. 25A.

FIG. 25A is an enlarged view of a part indicated by D in FIG. 21. FIG. 25B is a cross-sectional view at F3-F3' in FIG. 25A. In FIG. 25A, the part having the remaining width A is indicated by hatching. Although the opening 36 is formed in a lattice-like shape, the opening 36 is not formed at the side face 41 of the remaining width wt of the resist pattern. A part different from FIG. 24A is that adjacent remaining widths A have a part overlapping in a direction vertical to a longitudinal direction of the remaining width wt of the resist pattern. As a result, the collapse width w1 of the side face 41 of the remaining width wt of the resist pattern may be reduced. Although the lattice is depicted to have a planar shape that is rectangular, the shape may be square.

Figure 26:
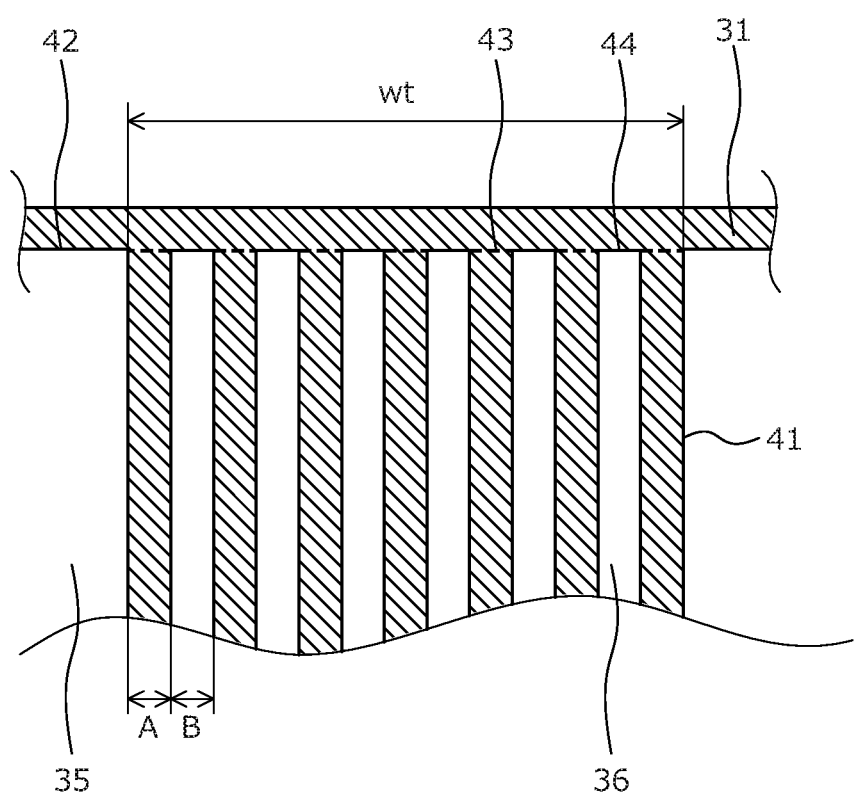
FIG. 26 is an enlarged view of a part indicated by E1 in FIG. 21.

FIG. 26 is an enlarged view of a part indicated by E1 in FIG. 21. An end 43 of the remaining width A, an end 44 of the opening 36, and the end 42 of the opening 35 of the resist pattern may be connected by the photoresist film 31. As a result, resist pattern collapse of the end 43 of the remaining width A, the end 44 of the opening 36, and the end 42 of the opening 35 of the resist pattern may be prevented. Further, a part of the end 42 of the opening 35 is not subject to ion implantation. Although FIG. 26 depicts an example in which the planar shape of the opening 36 is striped, the planar shape of the opening 36 may be a lattice.

Figure 27A:
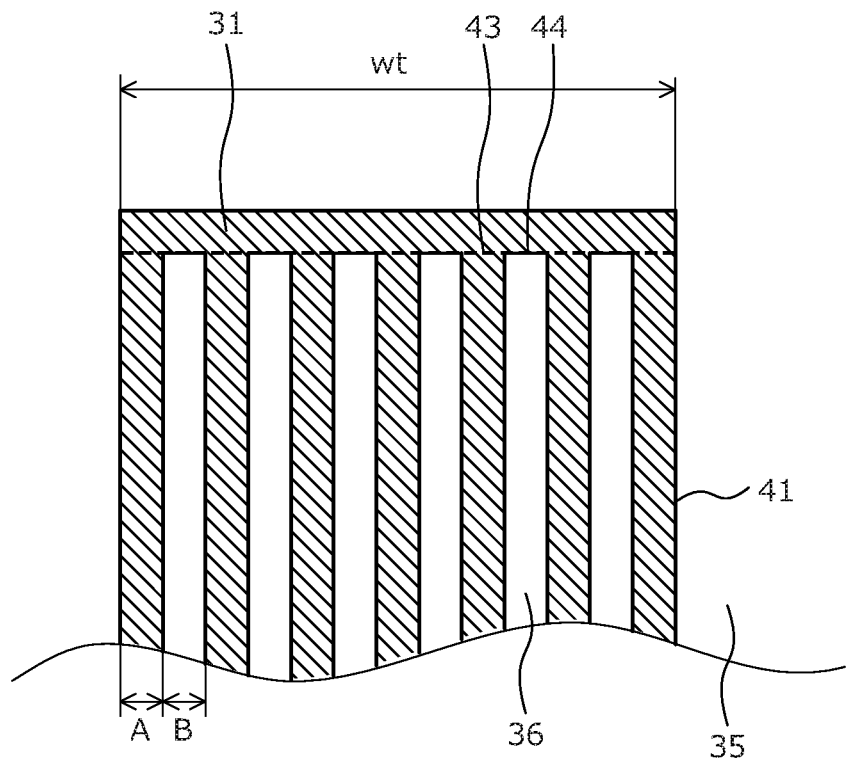
FIGS. 27A and 27B are enlarged views of a part indicated by E2 in FIG. 22.
Figure 27B:
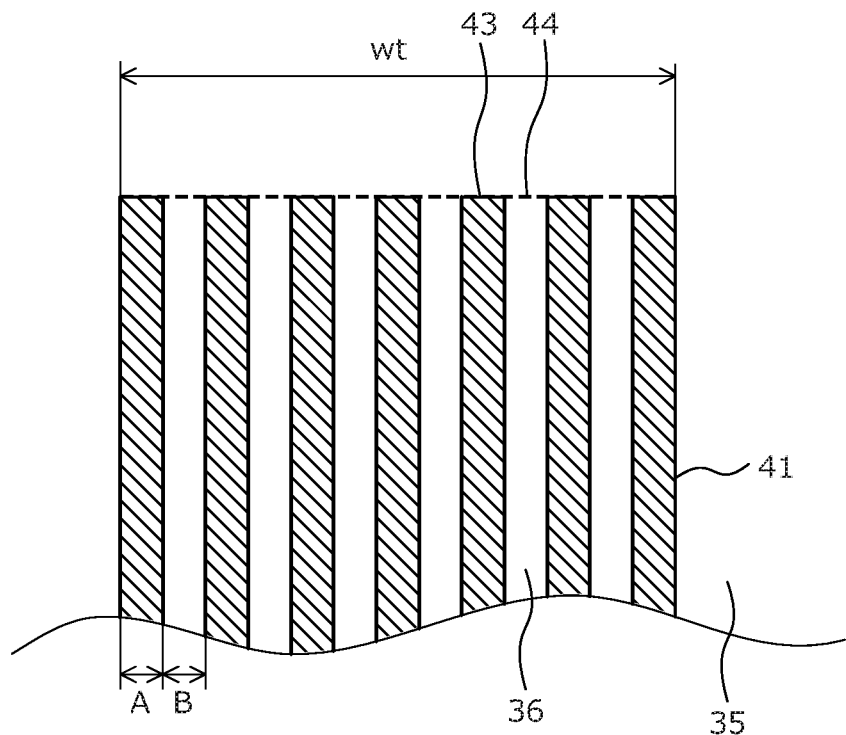

FIGS. 27A and 27B are enlarged views of a part indicated by E2 in FIG. 22. In FIG. 27A, the end 43 of the remaining width A and the end 44 of the opening 36 are connected by the photoresist film 31. A difference from FIG. 26 is that the end 42 of the opening 35 of the resist pattern is not connected. As a result, collapse of the end 43 of the remaining width A and the end 44 of the opening 36 of the resist pattern may be prevented. FIG. 27B differs from FIG. 27A in that the end 43 of the remaining width A and the end 44 of the opening 36 are not connected by the photoresist film 31. This shape may be used when ion implantation may be performed at the end 43 of the remaining width A and the end 44 of the opening 36. Although FIGS. 27A and 27B depict an example in which the planar shape of the opening 36 is striped, the planar shape of the opening 36 may be a lattice-like shape.

Figure 28:
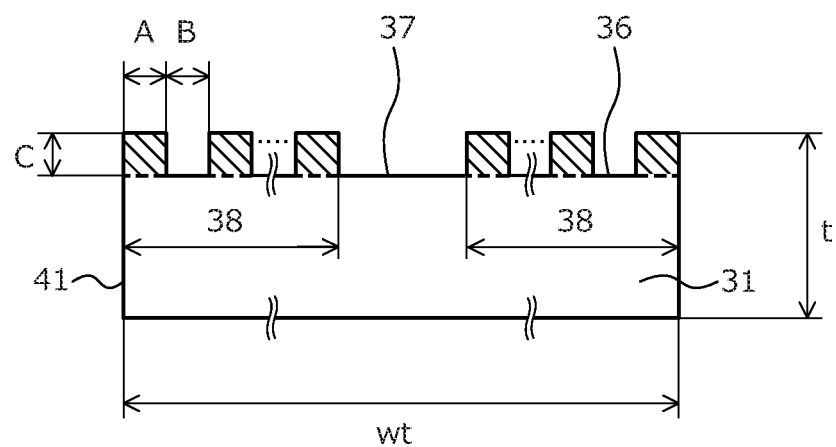
FIG. 28 is a cross-sectional view of a resist pattern free of collapse.

FIG. 28 is a cross-sectional view of a resist pattern free of collapse. An opening formation region 38 in which the opening 36 is formed in plural on both side faces 41 of the remaining width wt of the resist pattern is provided. A width of the opening formation region 38 is wider than the collapse width w101 depicted in FIG. 19 and between the opening formation regions 38, an opening 37 is formed. As a result, effects similar to the resist pattern in FIG. 9 may be obtained.

The present invention is not limited to the described embodiments and may be various modified within a range not deviating from the spirit of the invention. For example, in the above embodiments, although a case where helium is irradiated has been described as an example, without limitation hereto, the present invention is applicable in cases where ion implantation of a predetermined impurity is performed using, for example, high acceleration energy of about 1.5 MeV or higher (for example, the range is 8 μm or more), or a case where the thickness of a photoresist film used as a resist mask (shielding film) is, for example, about 30 μm or more. Further, in the above embodiments, although a RC-IGBT has been described as an example, without limitation hereto, the present invention is applicable to a device having various element structures for which ion implantation of an impurity, helium irradiation using high acceleration energy under the conditions above, etc. are performed. For example, the present invention is applicable to a semiconductor device that combines other semiconductor elements and the FWD for which lifetime killers are introduced. Further, dimensions, impurity concentrations, etc. are various set according to required specifications. The present invention is further implemented when the conductivity types (n-type, p-type) are inverted with each other.

According to the embodiments, collapse of resist pattern edges is prevented, enabling a resist mask to be used. Therefore, compared to a case where a hard mask is used, the minimum processing dimension of the mask opening may be reduced and the alignment precision of the semiconductor wafer may be improved. Further, at the time of device design, the design margin may be reduced, enabling the chip side to be reduced. As a result, the number of chips that may be cut from one semiconductor wafer may be increased.

According to the method of manufacturing a semiconductor device of the embodiments, an effect is achieved in that when a photoresist film is used as a mask, collapse of resist pattern edges may be prevented, enabling the design margin to be reduced.

As described, the method of manufacturing a semiconductor device according to the embodiments is useful for semiconductor devices for which ion implantation has to be performed at a high acceleration energy.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of manufacturing a semiconductor device, the method comprising:
   providing a semiconductor wafer;
   forming a photoresist film on a main surface of the semiconductor wafer;
   forming a first mask pattern on the photoresist film;
   forming a second mask pattern on the photoresist film;
   selectively removing portions of the photoresist film according to the first mask pattern and the second mask pattern, to respectively form a first opening and a second opening in the photoresist film, a position of the second opening differing from that of the first opening; and
   performing ion implantation of an impurity into the semiconductor wafer, using the photoresist film having the first and second openings formed therein as a mask, wherein the portions of the photoresist film according to the first mask pattern are selectively removed after forming the first mask pattern and before forming the second mask pattern.

2. The method according to claim 1, wherein the first opening and the second opening are formed to be separated from each other.

3. The method according to claim 1, wherein a width of the second opening is narrower than a width of the first opening.

4. The method according to claim 1, wherein a depth of the second opening is 0.5 µm to 1 µm.

5. The method according to claim 1, wherein a width of the second opening is 1 µm to 3 µm.

6. The method according to claim 1, wherein the second opening includes a plurality of openings, each of which has a width of 1 µm to 3 µm.

7. The method according to claim 1, wherein the second opening includes a plurality of openings that are arranged in a row at an interval of 1 µm to 3 µm.

8. The method according to claim 1, wherein the forming the photoresist film includes applying a chemically amplified photoresist to the main surface of the semiconductor wafer.

9. The method according to claim 1, wherein the forming the photoresist film includes applying a positive photoresist to the main surface of the semiconductor wafer.

10. The method according to claim 1, wherein the forming the photoresist film includes applying a negative photoresist to the main surface of the semiconductor wafer.

11. The method according to claim 1, wherein the semiconductor wafer includes a first region and a second region; and
the method further comprises forming a first semiconductor element in the first region of the semiconductor wafer and forming a second semiconductor element in the second region of the semiconductor wafer, before forming the photoresist film, wherein
the first opening is at a location corresponding to a formation region of the second region.

12. The method according to claim 11, wherein the semiconductor wafer is of a first conductivity type,
the first semiconductor element is an insulated gate bipolar transistor,
the second semiconductor element is a diode,
forming the first semiconductor element and the second semiconductor element includes forming, in a surface layer at the main surface of the semiconductor wafer, a semiconductor region of a second conductivity type, which constitutes an anode region of the diode and a base region of the insulated gate bipolar transistor, and
performing the ion implantation includes implanting the impurity from the main surface of the semiconductor wafer near an interface between the semiconductor wafer and the semiconductor region of the second conductivity type.

13. The method according to claim 11, wherein the semiconductor wafer is of a first conductivity type,
the semiconductor wafer has, in addition to the main surface, another main surface,
the first semiconductor element is an insulated gate bipolar transistor,
the second semiconductor element is a diode,
forming the first semiconductor element and the second semiconductor element includes forming, in a surface layer at the another main surface of the semiconductor wafer, a semiconductor region of a second conductivity type, which constitutes an anode region of the diode and a base region of the insulated gate bipolar transistor, and
performing the ion implantation includes implanting the impurity from the another main surface of the semiconductor wafer near an interface between the semiconductor wafer and the semiconductor region of the second conductivity type.

14. A method of manufacturing a semiconductor device, the method comprising:
providing a semiconductor wafer;
forming a photoresist film on a main surface of the semiconductor wafer;
forming a first mask pattern on the photoresist film;
forming a second mask pattern on the photoresist film;
selectively removing portions of the photoresist film according to the first mask pattern and the second mask pattern, to respectively form a first opening and a second opening in the photoresist film, a position of the second opening differing from that of the first opening;
performing ion implantation of an impurity into the semiconductor wafer, using the photoresist film having the first and second openings formed therein as a mask; and
after selectively removing the portions of the photoresist film and before performing the ion implantation, irradiating ultraviolet rays on the photoresist film, or heating the photoresist film.

15. A method of manufacturing a semiconductor device, the method comprising:
providing a semiconductor wafer;
forming a photoresist film on a main surface of the semiconductor wafer;
forming a first mask pattern on the photoresist film;
forming a second mask pattern on the photoresist film;
selectively removing portions of the photoresist film according to the first mask pattern and the second mask pattern, to respectively form a first opening and a second opening in the photoresist film, a position of the second opening differing from that of the first opening;
performing ion implantation of an impurity into the semiconductor wafer, using the photoresist film having the first and second openings formed therein as a mask, wherein
a depth of the second opening is shallower than a depth of the first opening.

* * * * *